(12) United States Patent
Liang et al.

(10) Patent No.: US 10,770,559 B2
(45) Date of Patent: *Sep. 8, 2020

(54) GATE STRUCTURE AND METHODS OF FORMING METAL GATE ISOLATION

(71) Applicant: Taiwan Semiconductor Manufacturing Co., Ltd., Hsin-Chu (TW)

(72) Inventors: Chun-Sheng Liang, Changhua County (TW); Meng-Fang Hsu, Hsinchu (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 172 days.

This patent is subject to a terminal disclaimer.

(21) Appl. No.: 16/397,224

(22) Filed: Apr. 29, 2019

(65) Prior Publication Data

US 2019/0334003 A1 Oct. 31, 2019

Related U.S. Application Data

(63) Continuation of application No. 15/964,557, filed on Apr. 27, 2018, now Pat. No. 10,276,676.

(51) Int. Cl.
| | | |
|---|---|---|
| *H01L 29/417* | (2006.01) | |
| *H01L 29/06* | (2006.01) | |
| *H01L 29/66* | (2006.01) | |
| *H01L 29/78* | (2006.01) | |
| *H01L 29/423* | (2006.01) | |

(52) U.S. Cl.
CPC .... *H01L 29/41791* (2013.01); *H01L 29/0649* (2013.01); *H01L 29/42356* (2013.01); *H01L 29/6681* (2013.01); *H01L 29/7856* (2013.01)

(58) Field of Classification Search
None
See application file for complete search history.

(56) References Cited

U.S. PATENT DOCUMENTS

| | | |
|---|---|---|
| 9,520,482 B1 | 12/2016 | Chang et al. |
| 9,659,786 B2 | 5/2017 | Greene et al. |
| 10,276,676 B1 * | 4/2019 | Liang ............... H01L 29/41791 |
| 2016/0133632 A1 | 5/2016 | Park et al. |
| 2018/0261514 A1 * | 9/2018 | Xie .................. H01L 29/66545 |
| 2018/0323277 A1 | 11/2018 | Zhou |

* cited by examiner

*Primary Examiner* — J. E. Schoenholtz
(74) *Attorney, Agent, or Firm* — Haynes and Boone, LLP

(57) ABSTRACT

A method of forming high-k metal gates (HKMGs) includes removing a dummy gate structure formed over a first fin and a second fin to form a trench that exposes portions of the first fin and the second fin, forming a high-k dielectric layer over the exposed portions of the first fin and the second fin, forming a capping layer over the high-k dielectric layer, forming a hard mask layer over the capping layer, such that the hard mask layer fills the trench completely, forming an isolation feature in the hard mask layer between the first fin and the second fin, the isolation feature having sidewalls that extend through the capping layer, removing the hard mask layer to expose the capping layer and the sidewalls of the isolation feature, and forming a conductive electrode over the capping layer and along the sidewalls of the isolation feature.

20 Claims, 19 Drawing Sheets

GATE STRUCTURE AND METHODS OF FORMING METAL GATE ISOLATION

CROSS REFERENCE

This application is a Continuation of U.S. patent application Ser. No. 15/964,557 entitled "METHOD OF FORMING METAL GATE ISOLATION," filed Apr. 27, 2018, now U.S. Pat. No. 10,276,676, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Such scaling down has also increased the complexity of processing and manufacturing ICs and, for these advances to be realized, similar developments in IC processing and manufacturing are needed. For example, polysilicon gates have been replaced by metal gates in an effort to improve device performance with decreased feature size. Although methods for performing the gate replacement process have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
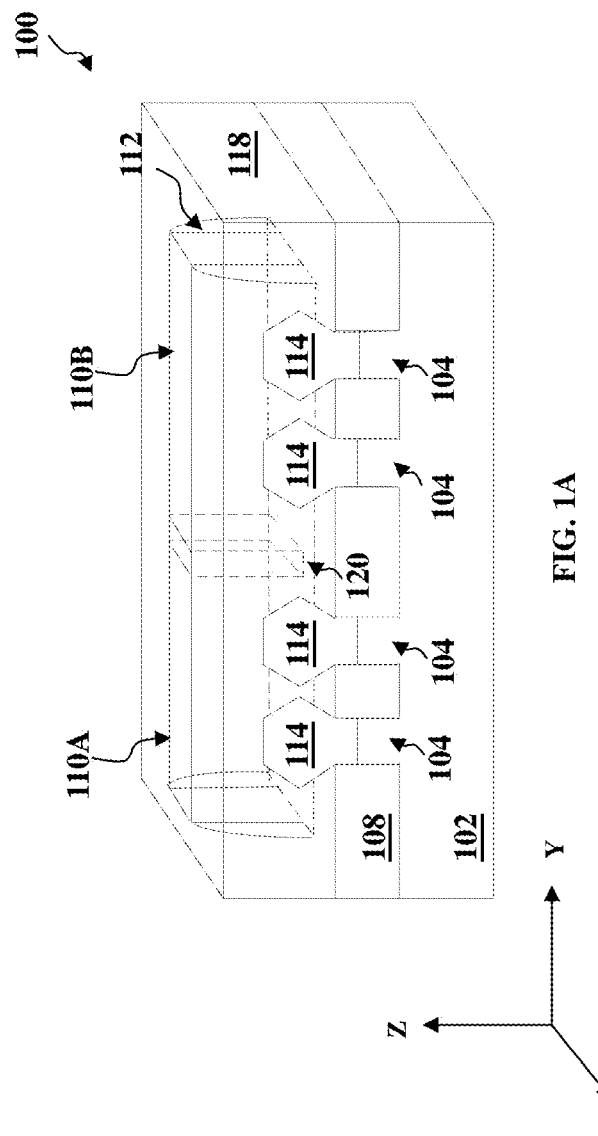
FIG. 1A shows a fragmentary three-dimensional perspective view of a semiconductor structure implemented with an embodiment of a method according to aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods, and more particularly to fabricating and cutting metal gates in semiconductor devices.

Replacing polysilicon gates with high-k metal gates (HKMG) have brought about improvement in device performance as feature sizes continue to decrease. Although methods of implementing HKMG have been generally adequate, they have not been entirely satisfactory in all aspects. In one example, challenges remain with respect to methods of forming HKMG for individual transistors. Generally, after a gate is formed in a three-dimensional field effect transistor (e.g., a fin-like field effect transistor, or FinFET), the gate is cut into two or more portions and subsequently separated by isolation feature(s) formed in the cut trench(es). In the context of forming HKMG, this cutting process may be performed either on the polysilicon (or dummy) gate prior to performing a HKMG replacement process (a process termed "cut poly gate," or CPG) or on the HKMG after the HKMG replacement process is completed (a process termed "cut metal gate," or CMG). In the case of CPG, because the isolation features are formed prior to the HKMG, multiple material layers (e.g., high-k dielectric layer, capping layer, work function metal layers, etc.) are formed along sidewalls of the isolation features, leading to reduced end-cap processing window and critical dimension (CD) scaling capabilities of the device. In the case of CMG, cutting conductive layers included in the HKMG could inadvertently remove portions of an interlayer dielectric (ILD) layer formed around the HKMG, thereby exposing source/drain features formed in the ILD layer to potential damage. Furthermore, etching gas(es) used during the CMG process may induce undesired shift in the HKMG's threshold voltage, thereby impairing performance of the device. The present disclosure provides methods of fabricating and cutting HKMG that circumvent one or more challenges associated with the CPG and CMG processes as discussed above.

Figure 1B:
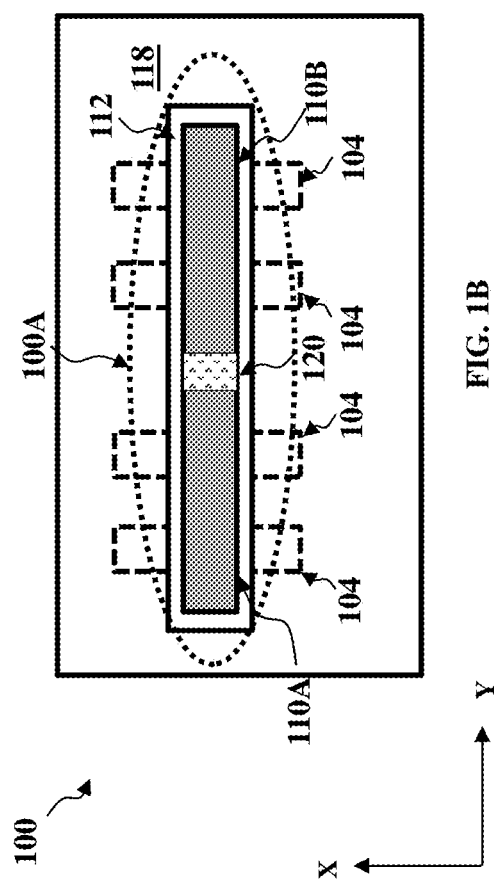
FIG. 1B shows a planar top view of the semiconductor structure of FIG. 1A according to aspects of the present disclosure.
Figure 2A:
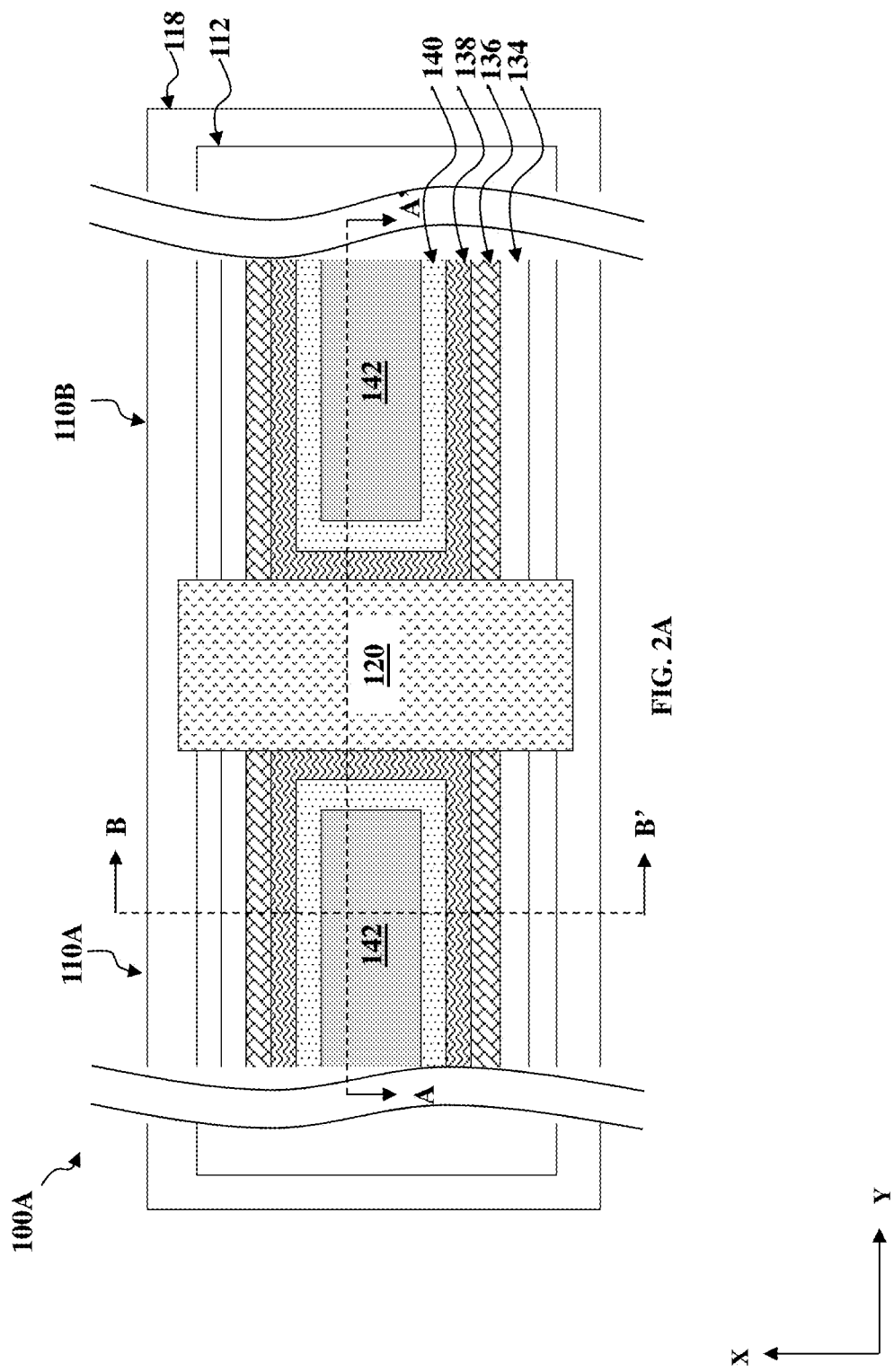
FIG. 2A shows a planar top view of the semiconductor structure of FIG. 1A according to aspects of the present disclosure.
Figure 2B:
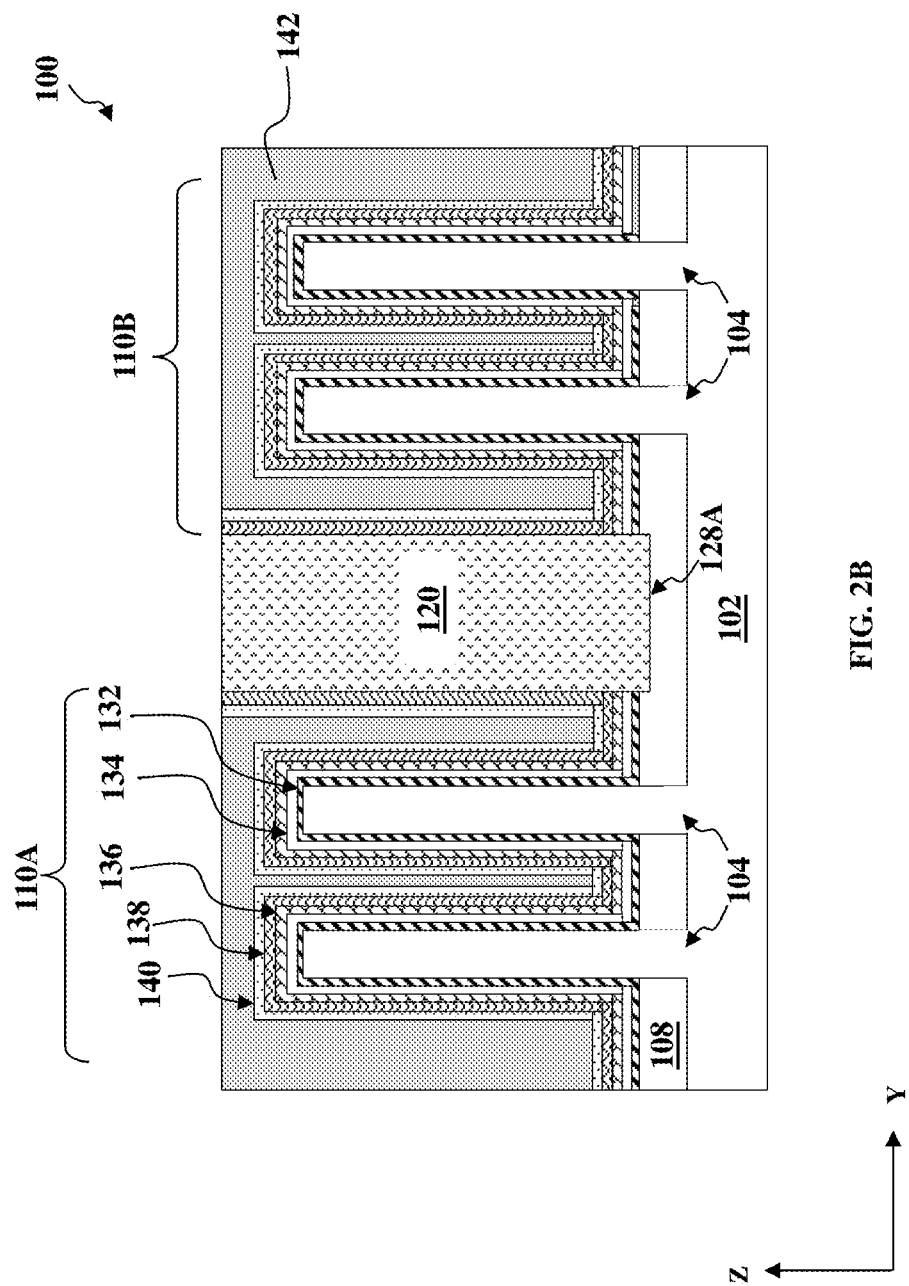
FIGS. 2B, 2C, and 2D show cross-sectional views of the semiconductor structure of FIG. 1A according to aspects of the present disclosure.
Figure 2C:
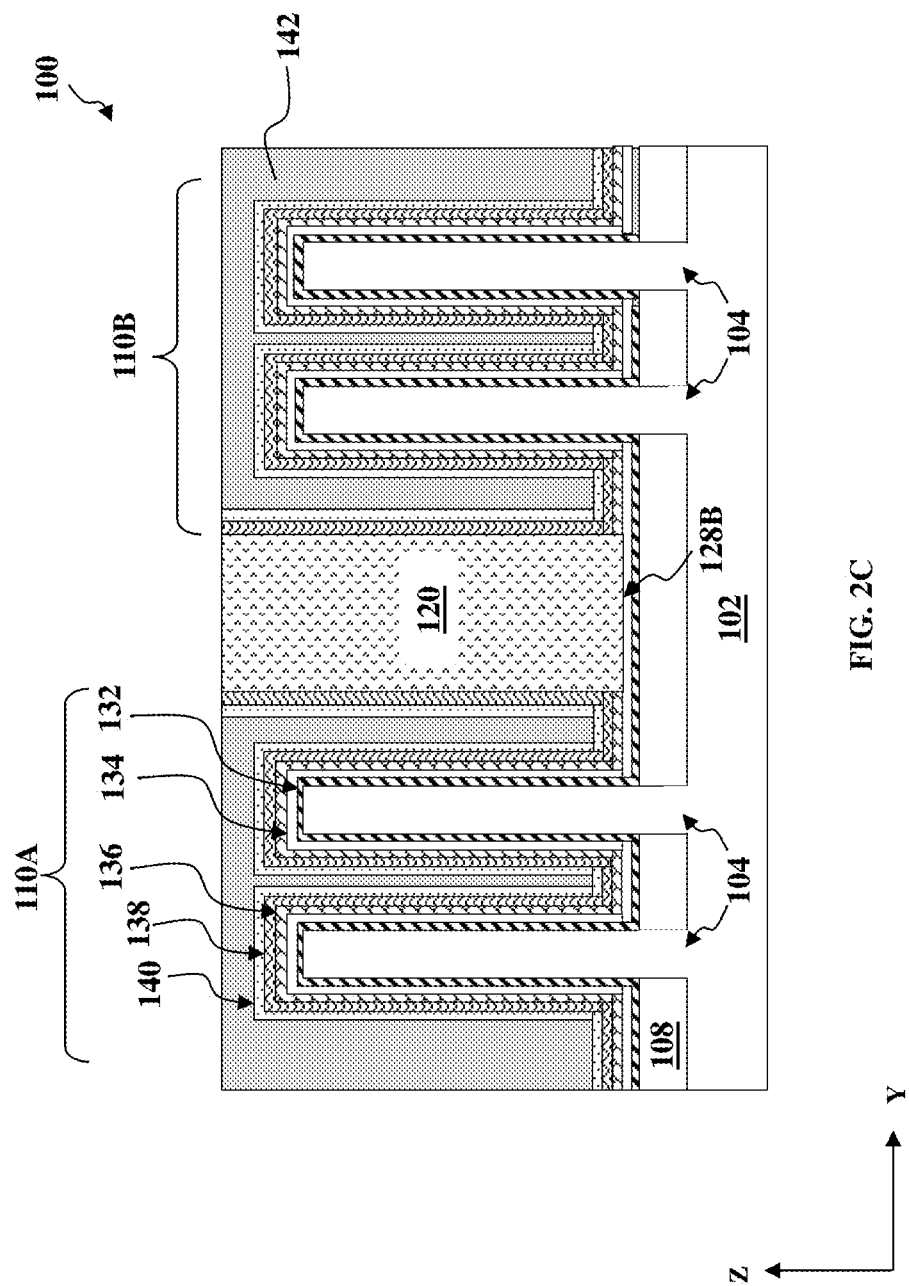
Figure 2D:
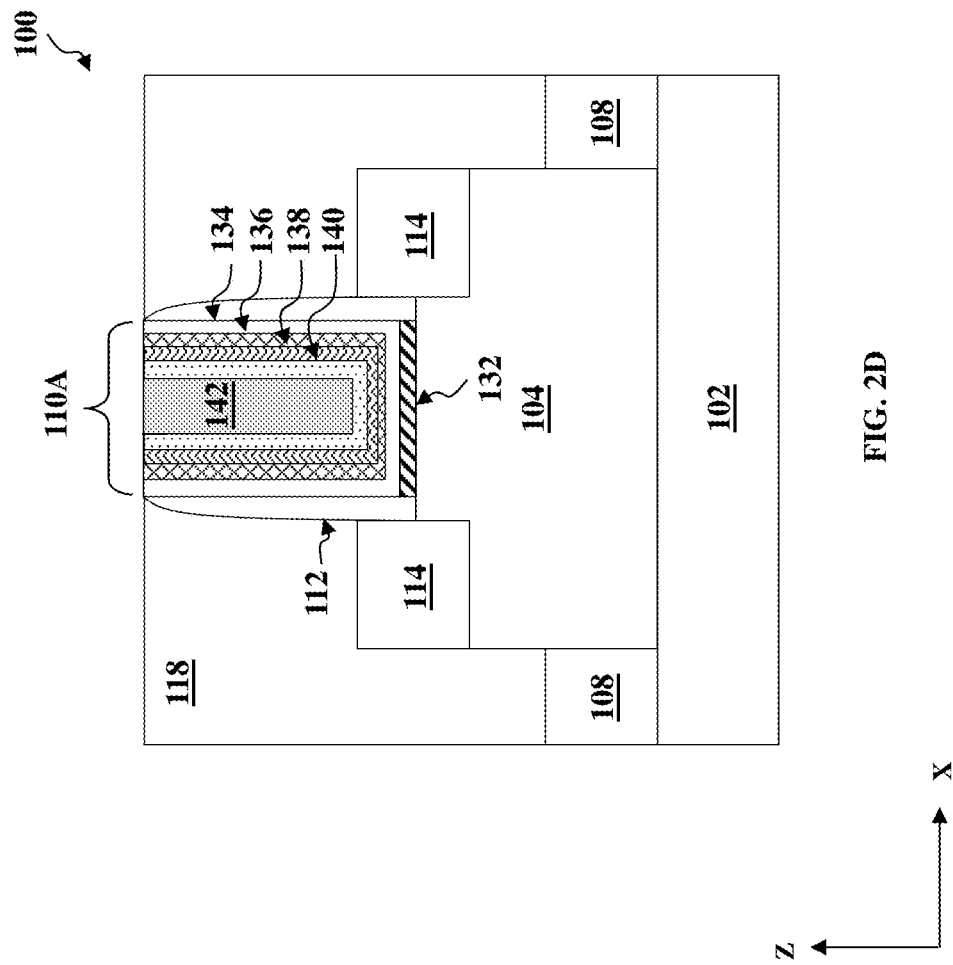

FIG. 1A illustrates a three-dimensional perspective few of a semiconductor device (or semiconductor structure) 100 in portion or in entirely. FIG. 1B illustrates a planar top view of the device 100 corresponding to FIG. 1A. FIG. 2A illustrates a planar top view of a portion 100A of the device 100; FIGS. 2B and 2C illustrate cross-sectional views of the device 100 taken along line A-A' of FIG. 2A; and FIG. 2D illustrates a cross-sectional view of the device 100 taken along line B-B' of FIG. 2A. The device 100 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 100 as illustrated is a three-dimensional FinFET device, the present disclosure may also provide embodiments for fabricating planar FET devices.

Referring to FIG. 1A, the device 100 includes a substrate 102, a plurality of fins 104 protruding out of the substrate 102, an isolation structure 108 over the substrate 102 and between the fins 104, a plurality of source/drain features 114 formed in the fins 104, high-k metal gate structures (HKMGs) 110A and 110B disposed over the isolation structure 108 and engaging a channel region of each of the fins 104, an isolation feature (or a dielectric feature) 120 separating the HKMGs 110A and 110B, gate spacers 112 disposed along sidewalls of the HKMGs 110A and 110B, and an interlayer dielectric (ILD) layer 118 disposed over the isolation structure 108 and separating various components of the device 100.

From a top view, referring to FIG. 1B, the fins 104 (shown in dotted line for being disposed below a top surface of the ILD layer 118) are arranged lengthwise along the X direction, and the HKMGs 110A and 110B are arranged lengthwise along the Y direction which is generally perpendicular to the X direction. Further, the isolation feature 120 is arranged and configured to separate the HKMG 110A from the HKMG 110B. Each of the HKMGs 110A and 110B engages their respective fins 104 to form individual FinFET transistors. Various components of the device 100 are discussed in detail below.

The substrate 102 may include an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AnnAs, AlGaAs, GaInAs, GaInP, and/or GaInAsP; and/or other suitable materials.

The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, and/or other suitable material layers.

The substrate 102 may include various circuit features formed thereon or therein including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some embodiments where the substrate 102 includes FETs, various doped regions, such as source/drain regions, are formed in or on the substrate 102. The doped regions may be doped with n-type dopants, such as phosphorus or arsenic, and/or p-type dopants, such as boron or BF2, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

The fins 104 may include one or more semiconductor materials such as silicon, germanium, silicon carbide, gallium arsenic, gallium phosphide, indium phosphide, indium arsenide, indium antimonide, SiGe, GaAsP, AnnAs, AlGaAs, GaInAs, GaInP, and/or GaInAsPIn, and/or other suitable materials. In some embodiments, the fins 104 include the same material(s) as the substrate 102. In some embodiments, the fins 104 include alternately stacked layers of two different semiconductor materials, such as layers of silicon and SiGe alternately stacked. The fins 104 may additionally or alternatively include dopants for improving the performance of the device 100. For example, the fins 104 may include n-type dopant(s) such as phosphorus or arsenic, or p-type dopant(s) such as boron or indium.

The isolation structure 108 may include silicon oxide, silicon nitride, silicon oxynitride, fluoride-doped silicate glass (FSG), a low-k dielectric material, and/or other suitable dielectric materials. The isolation structure 108 may be shallow trench isolation (STI) features. Other isolation structure such as field oxide, LOCal oxidation of silicon (LOCOS), and/or other suitable structures are possible. The isolation structure 108 may include a multi-layer structure, for example, having one or more thermal oxide liner layers adjacent to the fins 104.

The source/drain features 114 (referred to as epitaxial source/drain features) are disposed in source/drain regions of the fins 104. For example, a semiconductor material is epitaxially grown in the source/drain regions of the fins 104, forming epitaxial source/drain features 114 over a source region and a drain region of the fins 104. In the depicted embodiment, the HKMGs 110A and 110B each interposes the source/drain features 114, and a channel region (not shown) is defined in each fin 104 between the source/drain features 114. The HKMGs 110A and 110B and the source/drain features 114 thus form a portion of a transistor, such a pull-up transistor or a pull-down transistor, of the device 100. In many embodiments, the source/drain features 114 are doped with n-type dopants and/or p-type dopants. In some embodiments where the device 100 is configured as an n-type device (for example, having an n-channel), the source/drain features 114 are epitaxial layers including silicon and/or carbon, where silicon-containing epitaxial layers or silicon-carbon-containing epitaxial layers are doped with phosphorous and/or other n-type dopants (for example, forming a Si:P epitaxial layer or a Si:C:P epitaxial layer). In some embodiments where the device 100 is configured as a p-type device (for example, having a p-channel), the source/drain features 114 are epitaxial layers including silicon and germanium, where the silicon germanium containing epitaxial layers are doped with boron and/or other p-type dopants (for example, forming a Si:Ge:B epitaxial layer). In some embodiments, the source/drain features 114 include materials and/or dopants that achieve desired tensile stress and/or compressive stress in the channel region.

The isolation feature 120 may include one or more dielectric materials, such as a nitride (e.g., silicon nitride), an oxide (e.g., silicon oxide, aluminum oxide), an oxynitride (e.g., silicon oxynitride), spin-on glass (SOG), FSG, a low-k dielectric material, and/or other suitable insulating material. Particularly, the portion of the isolation feature 120 in physical contact with the HKMGs 110A and 110B includes one or more dielectric materials that do not react with the materials included in the HKMGs 110A and 110B. In the depicted embodiment, the isolation feature 120 includes dielectric material(s) different from that of the isolation structure 108, the gate spacers 112, and the ILD layer 118.

The ILD layer 118 may include one or more dielectric materials, such as silicon oxide, silicon nitride, silicon oxynitride, tetraethylorthosilicate (TEOS) oxide, un-doped silicate glass, or doped silicon oxide such as borophosphosilicate glass (BPSG), FSG, phosphosilicate glass (PSG), boron doped silicon glass (BSG), a low-k dielectric material, and/or other suitable dielectric materials. In the depicted embodiment, the ILD layer 118 includes a low-k dielectric material. Non-limiting examples of low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, and/or other low-k dielectric materials. The ILD layer 118 may include a multilayer structure having multiple dielectric materials. In many embodiments, the isolation structure 108, the gate spacers 112, the isolation feature 120, and the ILD layer 118 include different dielectric material(s).

The HKMGs 110A and 110B may include the same or different material layers such that they may achieve desired functionality according to design requirements for the device 100. In the depicted embodiment, the HKMGs 110A and 110B include the same material layers. In some embodiments, the HKMGs 110A and 110B include a high-k gate dielectric layer (or a high-k dielectric layer) and a conductive gate electrode. The HKMGs 110A and 110B may additionally include numerous other layers, such as interfacial layers, capping layers, diffusion layers, barrier layers, hard mask layers, and/or other suitable material layers. In some embodiments, the high-k dielectric layer is disposed over an interfacial layer (including a dielectric material, such as silicon oxide), and the conductive gate electrode is disposed over the high-k dielectric layer. Components of the HKMGs 110A and 110B are discussed in detail below. The gate spacers 112 may include a single layer or multiple layers of a dielectric material, such as silicon oxide, silicon nitride, silicon oxynitride, silicon carbide, and/or other suitable dielectric materials.

Referring to FIGS. 2A-2D, the HKMGs 110A and 110B each includes a high-k dielectric layer 134 over the fins 104 and the isolation structure 108, a capping layer 136 over the high-k dielectric layer 134, a barrier layer 138 over the capping layer 136, and a conductive electrode that includes a work function metal layer 140 over the barrier layer 138 and a bulk conductive layer 142 over the work function metal layer 140. In many embodiments, referring to FIGS. 2B-2D, the HKMGs 110A and 110B may further include an interfacial layer 132 disposed over the fins 104 and under the high-k dielectric layer 134. In some embodiments, the barrier layer 138 may be omitted. In many embodiments, the work function metal layer 140 includes multiple conductive layers.

From the top view shown in FIG. 2A, which is an enlarged view of a portion 100A of FIG. 1B, the high-k dielectric layer 134 is formed on sidewalls of the gate spacers 112 along the Y direction but does not extend along sidewalls of the isolation feature 120 in the X direction. Similarly, the capping layer 136 is formed on the high-k dielectric layer 134 along the Y direction but does not extend along the sidewalls of the isolation feature 120 in the X direction. On the other hand, the barrier layer 138 is configured to be U-shaped, with the bottom of the "U" disposed along the sidewalls of the isolation feature 120 in the X direction and the sides of the "U" disposed on the capping layer 136 along the Y direction. Similarly, the work function metal layer 140 is configured to be U-shaped, with the bottom of the "U" disposed on the barrier layer 138 along the sidewalls of the isolation feature 120 in the X direction and the sides of the "U" disposed on the barrier layer 138 along the Y direction. For embodiments in which the barrier layer 138 is omitted, the work function metal layer 140 is still configured to be U-shaped, with the bottom of the "U" disposed along the sidewalls of the isolation feature 120 in the X direction and the sides of the "U" disposed on the capping layer 136 along the Y direction.

From the cross-sectional view taken along the line A-A' (i.e., the Y direction) of FIG. 2A, referring to FIGS. 2B and 2C, the fins 104 protrude out of the substrate 102 and have a top surface above a top surface of the isolation structure 108. The isolation feature 120 is disposed between two adjacent fins 104, the isolation feature 120 having a top surface above the top surface of the fins 104, such that the HKMG 110A is completely separated from HKMG 110B to avoid shorting between FinFET devices formed therefrom. In some embodiments (FIG. 2B), a bottom surface 128A of the isolation feature 120 extends through the high-k dielectric layer 134 and the interfacial layer 132 to below a top surface of the isolation structure 108. In other embodiments (FIG. 2C), a bottom surface 128B of the isolation feature 120 extends to contact the high-k dielectric layer 134.

Still referring to FIGS. 2B and 2C, the high-k dielectric layer 134 is disposed over the interfacial layer 132 but not along the sidewalls of the isolation feature 120, and the capping layer 136 is disposed over the high-k dielectric layer 134 (i.e., not along the sidewalls of the isolation feature 120). In further embodiments where the barrier layer 138 is present, the barrier layer 138 is disposed over the capping layer 136 and along (i.e., contacting) the sidewalls of the isolation feature 120, and the work function metal layer 140 is disposed over the barrier layer 138. In other words, the barrier layer 138 and the work function metal layer 140 are configured to form a "U" shape in a space defined by the fins 104 and the sidewalls of isolation feature 120, with the bottom of the "U" being disposed over the capping layer 136 and the sides of the "U" being disposed along the sidewalls of the isolation feature 120 and along sidewalls of the fins 104. Furthermore, the bulk conductive layer 142 is disposed over the work function metal layer 140, thereby filling a space defined by the sidewalls of the isolation feature 120 and the gate spacer 112. In the depicted embodiment, a top surface of each of the barrier layer 138, the work function metal layer 140, and the bulk conductive layer 142 is coplanar with the top surface of the isolation feature 120, while a top surface of each of the interfacial layer 132, the high-k dielectric layer 134, and the capping layer 136 is below the top surface of the isolation feature 120.

From the cross-sectional view taken along the line B-B' (i.e., the X direction) of FIG. 2A, referring to FIG. 2D, the HKMG 110A formed in the fin 104 is depicted; although the following description is equally applicable to the HKMG 110B formed in the fin 104. As discussed above, the HKMG 110A interposes between source/drain features 114 and engages the fin 104 in the channel region defined by the source/drain features 114. The interfacial layer 132 is disposed over the fin 104 along the X direction. The high-k dielectric layer 134, the capping layer 136, the barrier layer 138, and the work function metal layer 140, which are formed in a configuration discussed above with reference to FIGS. 2B and 2C, each exhibit a "U" shape with the bottom of each "U" shape disposed along the X direction and the sides of the "U" shape along the Z direction. For example, the high-k dielectric layer 134 is formed along sidewalls of the gate spacers 112, which are oriented along the Z direction. The bulk conductive layer 142 subsequently fills a space defined by the work function metal layer 140. In the depicted embodiment, top surfaces of the ILD layer 118, the high-k dielectric layer 134, the capping layer 136, the barrier layer 138, and the work function metal layer 140, and the bulk conductive layer 142 are substantially coplanar.

In the depicted embodiment, the interfacial layer 132 includes an oxide material, such as silicon oxide; alternatively, the interfacial layer 132 includes silicon oxynitride. The high-k dielectric layer 134 may include one or more high-k dielectric materials (or one or more layers of high-k dielectric materials), such as hafnium silicon oxide (HfSiO), hafnium oxide (HfO2), alumina (Al2O3), zirconium oxide (ZrO2), lanthanum oxide (La2O3), titanium oxide (TiO2), yttrium oxide (Y2O3), strontium titanate (SrTiO3), and/or other suitable high-k dielectric materials.

The capping layer 136 may include one or more conductive material, such as titanium nitride (TiN), titanium silicon nitride (TiSiN), tantalum silicon nitride (TaSiN), tantalum nitride (TaN), tantalum carbide (TaC), tantalum carbide nitride (TaCN), and/or other suitable metal materials. In the depicted embodiment, the capping layer 136 includes a titanium-containing conductive material. The barrier layer 138 may include one or more conductive material, such as tantalum silicon nitride (TaSiN), tantalum nitride (TaN), tantalum carbide (TaC), tantalum carbide nitride (TaCN), titanium nitride (TiN), titanium silicon nitride (TiSiN), and/or other suitable metal materials. In the depicted embodiment, the capping layer 136 includes a tantalum-containing conductive material. In some embodiments, the barrier layer 138 is omitted from the HKMGs 110A and 110B.

The work function metal layer 140 may be a p-type or an n-type work function layer depending on whether the device 100 is configured to be a PFET (p-type) or an NFET (n-type). Examples of p-type work function material includes titanium nitride (TiN), tantalum nitride (TaN), ruthenium (Ru), molybdenum (Mo), tungsten (W), platinum (Pt), and/or suitable p-type materials. Examples of n-type work function material includes titanium (Ti), aluminum (Al), tantalum carbide (TaC), tantalum carbide nitride (TaCN), tantalum silicon nitride (TaSiN), titanium silicon nitride (TiSiN), and/or other suitable n-type materials. In s embodiments, the work function metal layer 140 includes multiple material layers of the same or different type in order to achieve a desired threshold voltage for each of the HKMGs 110A and 110B. In the depicted embodiment, the HKMGs 110A and 110B includes the same work function metal layer(s); though the present disclosure is not limiting. The bulk (or fill) conductive layer 142 may include aluminum (Al), copper (Cu), tungsten (W), cobalt (Co), ruthenium (Ru), and/or other suitable conductive materials.

Figure 3A:
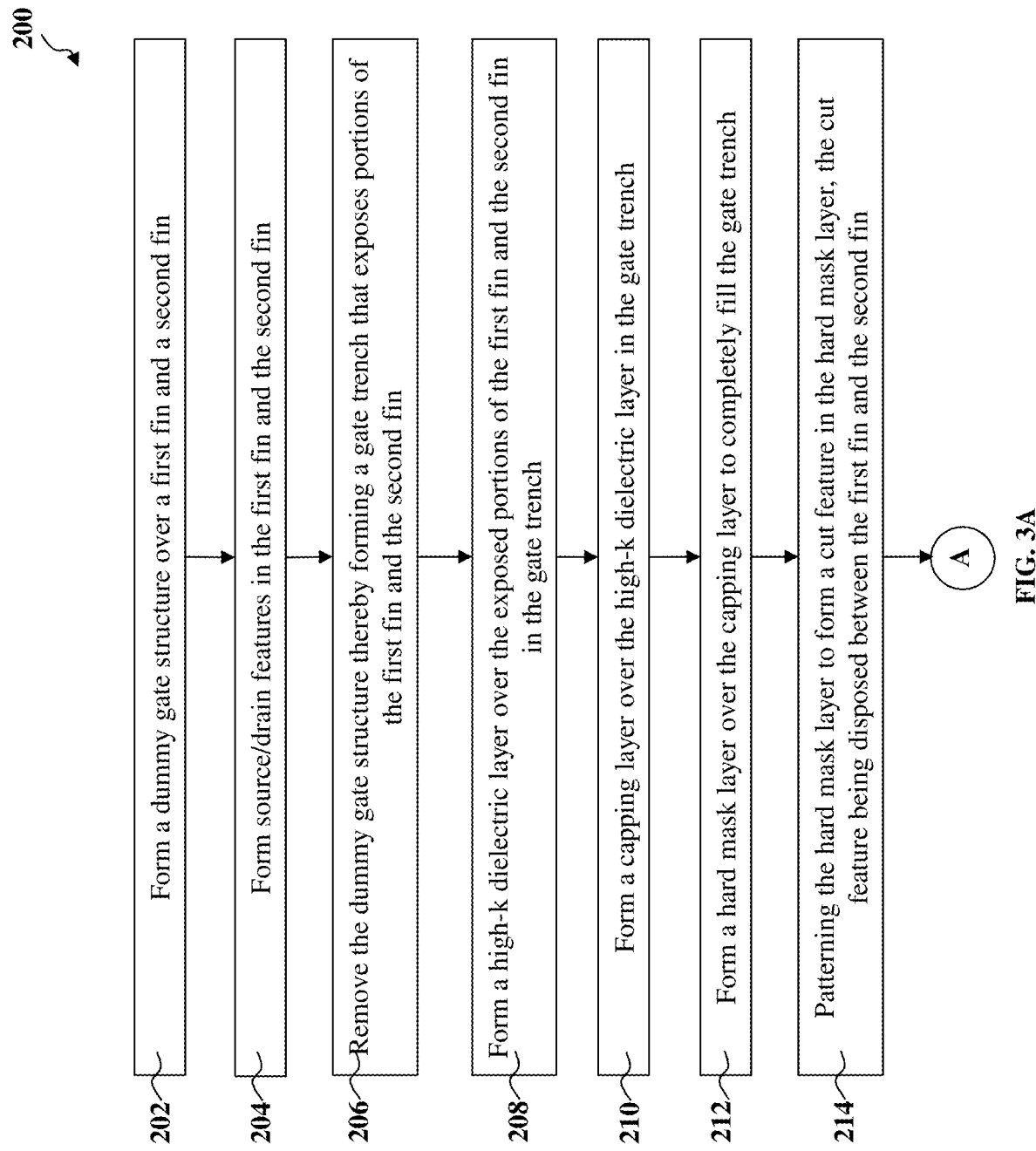
FIGS. 3A and 3B illustrate a flow chart of a method for forming the semiconductor structure shown in FIGS. 1A, 1B, 2A, 2B, 2C, and 2D according to aspects of the present disclosure.
Figure 3B:
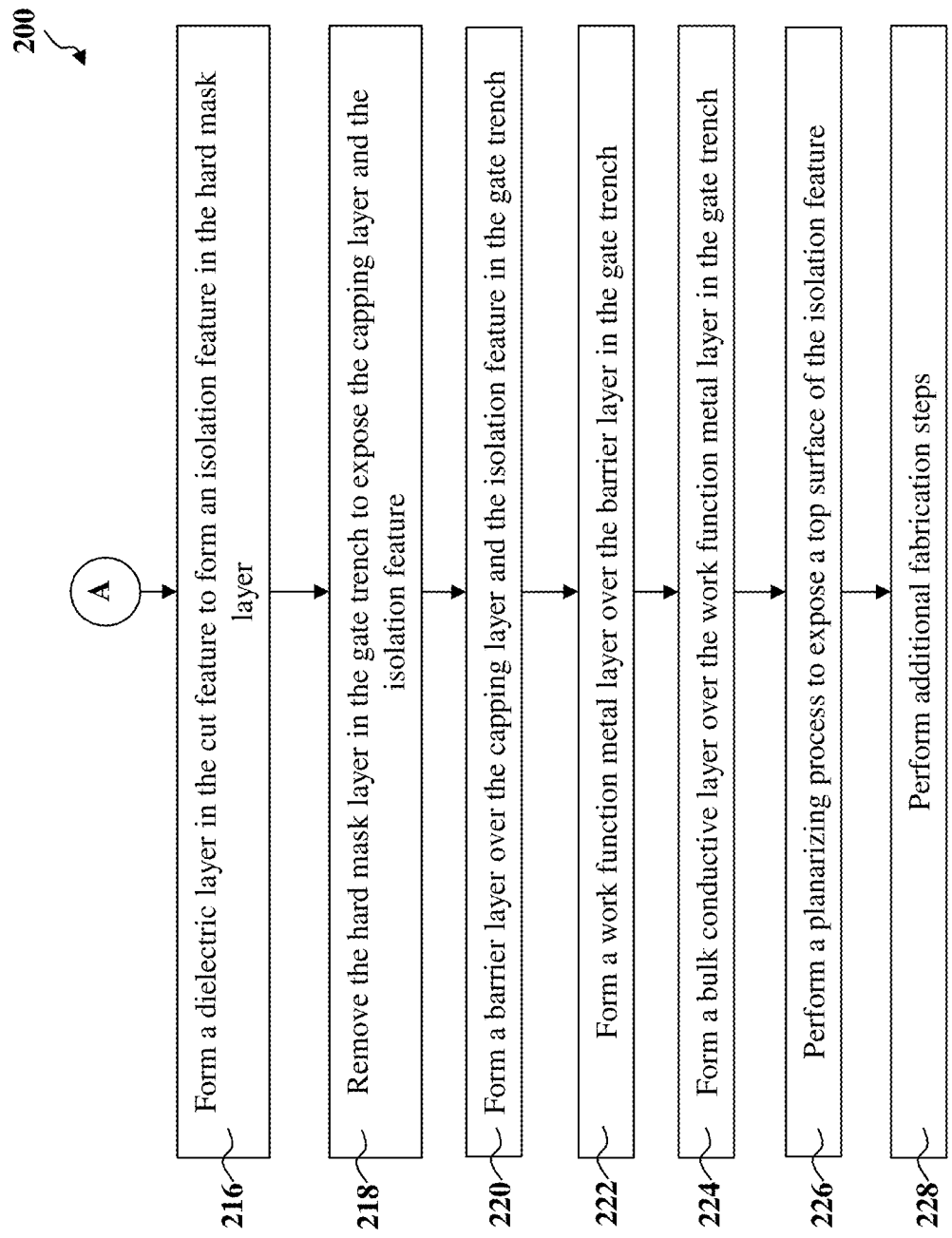

FIGS. 3A and 3B illustrate a flow chart of a method 200 for forming the device 100 in accordance with some embodiments of the present disclosure. The method 200 is merely an example, and is not intended to limit the present disclosure beyond what is explicitly recited in the claims. Additional operations can be performed before, during, and after the method 200, and some operations described can be replaced, eliminated, or moved around for additional embodiments of the method. The method 200 is described below in conjunction with FIGS. 4-13, which illustrate various cross-sectional views of the device 100 taken along the line A-A' during intermediate steps of the method 200.

Figure 4:
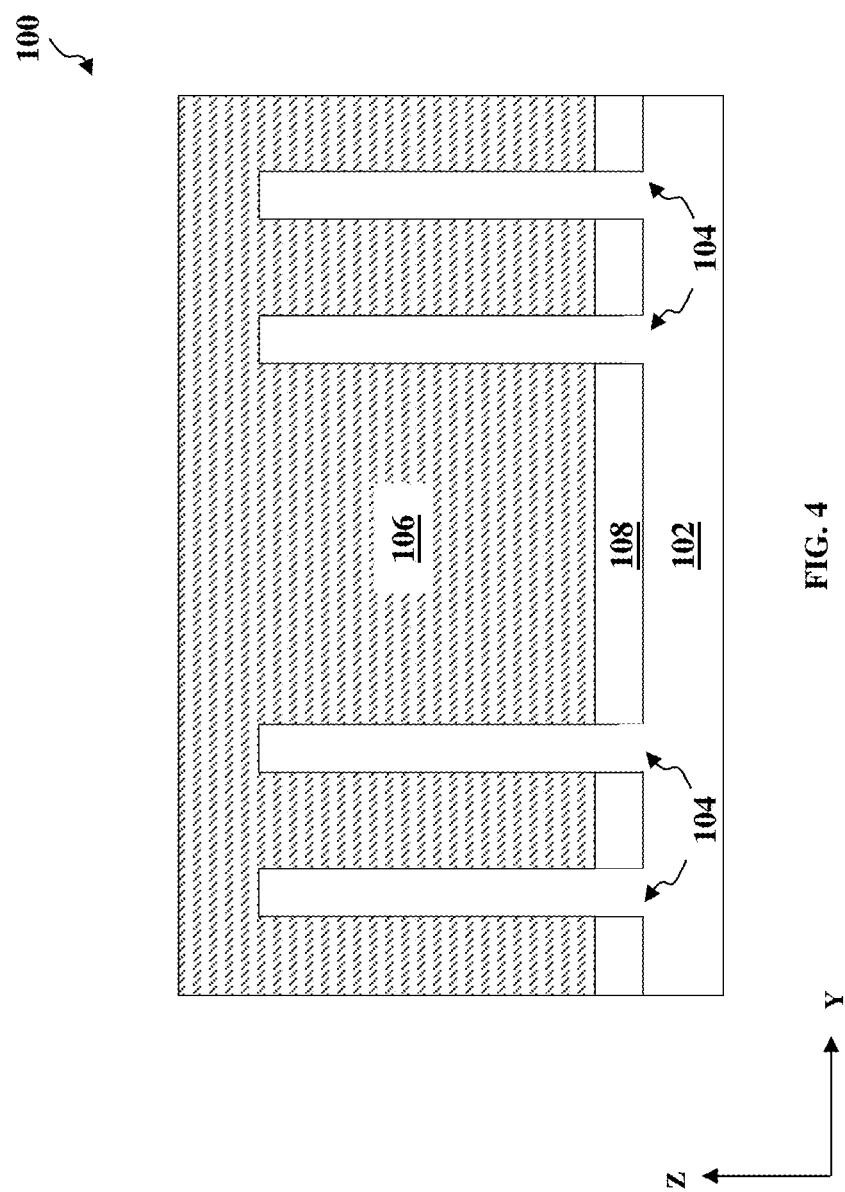
FIGS. 4, 5, 6, 7, 8, 9A, 9B, 10A, 10B, 11, 12, and 13 illustrate cross-sectional views of a semiconductor structure during intermediate steps of implementing an embodiment of a method according to aspects of the present disclosure.

At operation 202, referring to FIGS. 3A and 4, the method 200 forms a device 100 having a substrate 102, fins 104 (for example, including a first fin and a second fin) protruding out of the substrate 102, an isolation structure 108 disposed over the substrate 102 and between the fins 104. The various materials suitable for forming the substrate 102, the fins 104, and the isolation structure 108 have been discussed above with reference to FIGS. 1A-2D.

The substrate 102 may be a semiconductor substrate, such as a silicon substrate. The fins 104 may be formed by epitaxially growing one or more semiconductor layers over the entire area of the substrate 102 and then patterned to form the individual fins 104. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104 by etching the initial epitaxial semiconductor layers. The etching process can include dry etching, wet etching, reactive ion etching (RIE), and/or other suitable processes. A dry etching process may implement a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, an oxygen-containing gas (e.g., O2), a nitrogen-containing gas (e.g., N2), helium, argon, and/or other suitable gases and/or plasmas. A wet etching process may be implemented in hydrochloric acid (HCl), potassium hydroxide (KOH), ammonium hydroxide (NH4OH), hydrogen peroxide (H2O2), sulfuric acid (H2SO4), nitric acid (HNO3), hydrofluoric acid (HF), phosphoric acid (H3PO4), ammonium phosphate ((NH4)3PO4), tetramethylammonium hydroxide (TMAH), and/or other suitable etchants. Alternatively or additionally, the wet etching process may utilize a mixture of solutions such as a standard-clean 1 (SC1; also known as an ammonia-peroxide mixture (APM)) mixture including NH4OH, H2O2, and distilled water (DIW)), a standard-clean 2 (SC2) mixture including HCl, H2O2, and DIW, or a mixture of H2SO4, H2O2, and DIW.

The isolation structure 108 may be formed by one or more deposition and etching methods. The deposition methods may include thermal oxidation, chemical oxidation, and chemical vapor deposition (CVD), such as flowable CVD (FCVD). The etching methods may include dry etching and/or wet etching, followed by a planarizing method such as chemical mechanical polishing/planarizing (CMP).

Subsequently, referring to FIG. 4, the method 200 forms a dummy (or temporary) gate structure 106 over the fins 104, thereby engaging the fins 104 in a channel region (not shown), at operation 202. The dummy gate structure 106 includes a gate electrode comprising poly-crystalline silicon (or polysilicon), which may be formed by any deposition processes such as CVD, physical vapor deposition (PVD), low-pressure chemical vapor deposition (LPCVD), plasma-enhanced CVD (PECVD), and/or other suitable deposition processes. Although not depicted in FIG. 4, the dummy gate structure 106 may additionally include other material layers such as gate dielectric layers, interfacial layers, diffusion layers, barrier layers, hard mask layers, and/or other suitable layers, portions of which, along with the gate electrode, will be removed in a subsequent gate replacement process. Various layers included in the dummy gate structure 106 may be formed by any suitable deposition processes and subsequently patterned by lithography and etching processes. In the depicted embodiment, an interfacial layer (e.g., the interfacial layer 132 as shown in FIGS. 2B-2D) is formed over the fins 104 and the isolation structure 108 prior to forming the dummy gate structure 106 and is subsequently removed during the gate replacement process. Alternatively, the interfacial layer may remain over the fins 104 and the isolation structure 108 when implementing the gate replacement process. In the depicted embodiment, a gate dielectric layer (high-k or otherwise) is omitted in the dummy gate structure 106.

Still referring to FIG. 4, the method 200 at operation 202 additionally forms gate spacers 112 on sidewalls of the dummy gate structure 106. The gate spacers 112 may include a dielectric material, such as silicon oxide, silicon nitride, silicon oxynitride, silicon carbide, and/or other suitable dielectric materials, and may include one or multiple layers of material. The gate spacers 112 may be formed by depositing a spacer material as a blanket over the isolation structure 108, the fins 104, and the dummy gate structure 106. Then the spacer material is etched by an anisotropic etching process to expose the isolation structure 108, a top surface of the dummy gate structure 106, and a top surface of the fins 104. Portions of the spacer material on the sidewalls of the dummy gate structure 106 become the gate spacers 112.

Referring to FIGS. 1A, 3A, and 4, the method 200 at operation 204 forms the source/drain features 114 in the device 100. The various materials suitable for forming the source/drain features 114 have been discussed above with reference to FIGS. 1A-2D. In the depicted embodiment, the method 200 forms recesses (e.g., by etching; not shown) in portions of the fins 104, and epitaxially grows semiconductor materials in the recesses. A cleaning process may be optionally performed to clean the recesses with a hydrofluoric acid (HF) solution or other suitable solution(s) prior to epitaxially growing the semiconductor materials. The semiconductor materials may be raised above the top surface of the recessed fins 104, as illustrated in FIG. 1A. The method 200 may form the source/drain features 114 separately for NFET and PFET devices. For example, the method 200 may form the source/drain features 114 with n-type doped silicon for NFET devices or p-type doped silicon germanium for PFET devices. The method 200 may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof to form the source/drain features 114.

Thereafter, the method 200 forms various features including a contact etch stop layer (CESL; not shown), the ILD layer 118, and/or other suitable material layers such as protective hard mask layer(s) over the source/drain features 114, the dummy gate structure 106, the gate spacers 112, and the isolation structure 108. The CESL may comprise silicon nitride, silicon oxynitride, silicon nitride with oxygen (O) or carbon (C) elements, and/or other suitable materials, and may be formed by CVD, PVD, atomic layer deposition (ALD), and/or other suitable methods. The various materials suitable for forming the ILD layer 118 have been discussed above with reference to FIGS. 1A-2D. The ILD layer 118 may be formed by PECVD, FCVD, and/or other suitable methods. The method 200 then performs one or more CMP processes to planarize a top surface of the device 100, thereby exposing the top surface of the dummy gate structure 106, as depicted in FIG. 4.

Figure 5:
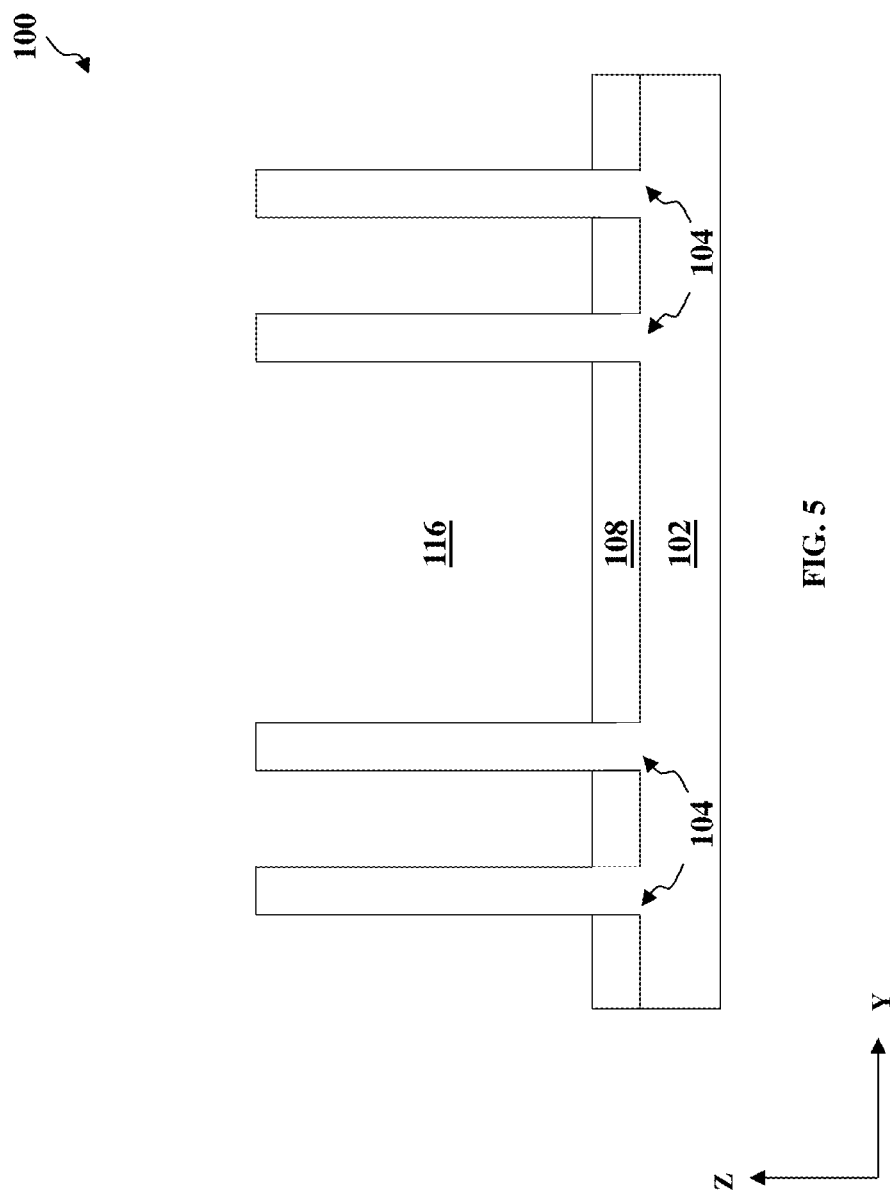

At operation 206, referring to FIGS. 3A and 5, the method 200 removes the dummy gate structure 106 to form a gate trench 116. In the depicted embodiment, the gate trench 116 exposes portions (including the channel region) of the fins 104 and the isolation structure 108. The method 200 at operation 206 may include one or more etching processes that are selective to the materials included in the dummy gate structure 106 (e.g., the polysilicon included in the gate electrode of the dummy gate structure 106). The etching processes may include dry etching, wet etching, RIE, and/or other suitable etching methods.

Figure 6:
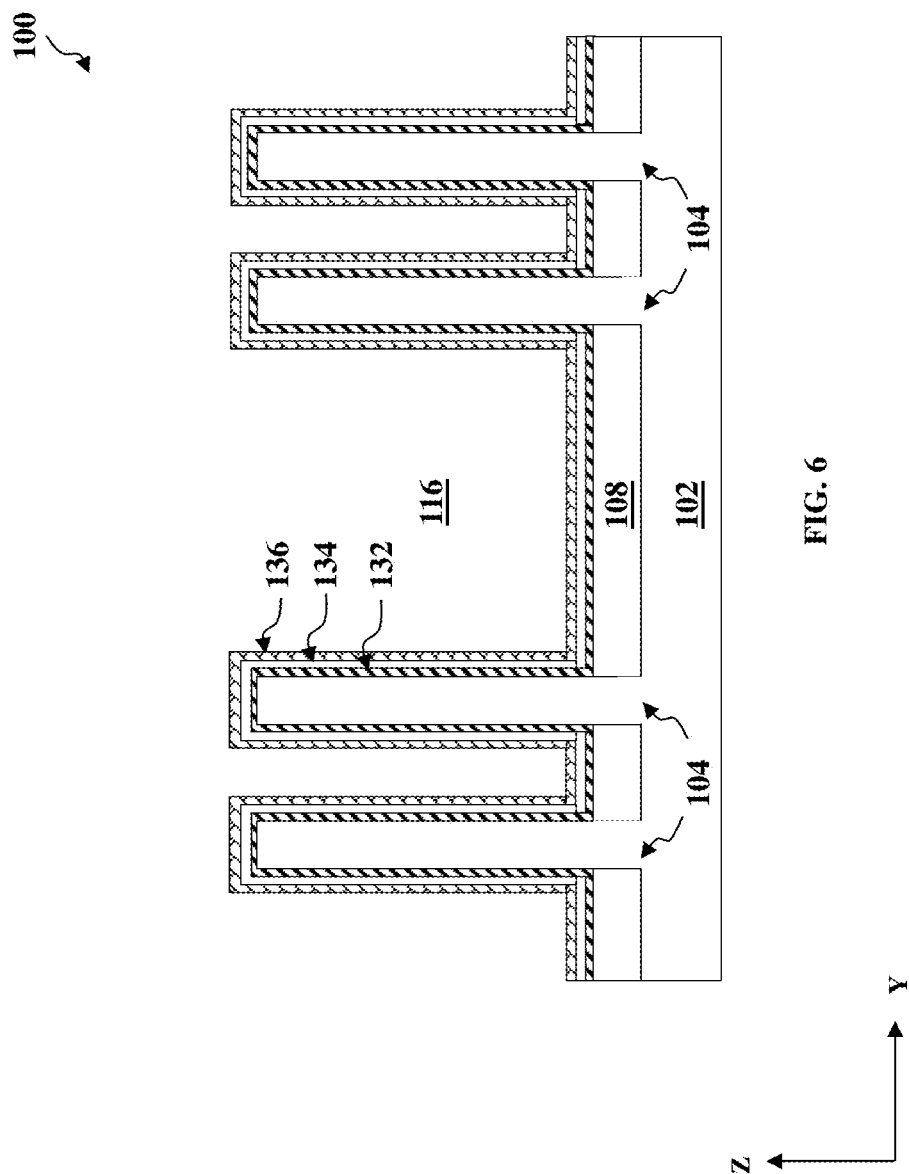

At operation 208, referring to FIGS. 3A and 6, the method 200 deposits the high-k dielectric layer 134 over the exposed portions of the fins 104 and the isolation structure 108 in the gate trench 116. In the depicted embodiment, the method 200 at operation 208 forms the interfacial layer 132 over the exposed portions of the fins 104 and the isolation structure 108 prior to forming the high-k dielectric layer 134 in the gate trench 116. As discussed above, the interfacial layer 132 may include a dielectric material such as silicon oxide or silicon oxynitride, and may be formed by chemical oxidation, thermal oxidation, ALD, CVD, LPCVD, PECVD, and/or other suitable methods. The various materials suitable for forming the high-k dielectric layer 134 have been discussed above with reference to FIGS. 2B-2D. The high-k dielectric layer 134 may include one or more layers of high-k dielectric material, and may be deposited using CVD, ALD and/or other suitable methods.

At operation 210, still referring to FIGS. 3A and 6, the method 200 forms the capping layer 136 over the high-k dielectric layer 134 in the gate trench 116. The various materials suitable for forming the capping layer 136 have been discussed above with reference to FIGS. 2A-2D. In the depicted embodiment, the capping layer 136 includes a conductive titanium-containing material, such as titanium nitride (TiN), titanium silicon nitride (TiSiN), and/or other suitable conductive materials. In the present embodiment, the material for the capping layer 136 is chosen to have good adhesion with subsequently formed material layers in the HKMG yet not reactive with the same material layers. The capping layer may be deposited using CVD, PVD, ALD, LPCVD, PECVD, high-density plasma CVD (HDPCVD), metal organic CVD (MOCVD), remote plasma CVD (RP-CVD), atmospheric pressure CVD (APCVD), and/or other suitable methods.

Figure 7:
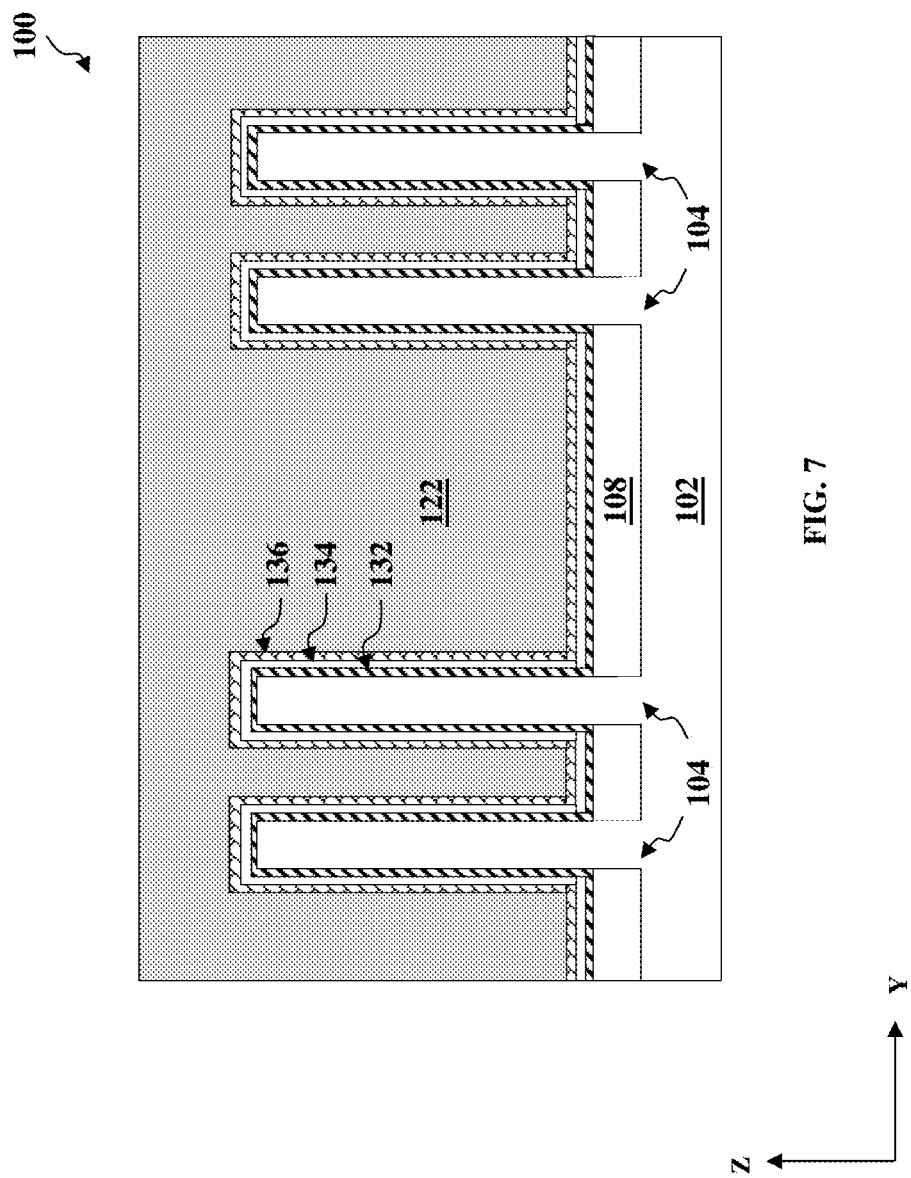

At operation 212, referring to FIGS. 3A and 7, the method 200 forms a hard mask layer 122 over the capping layer 136 in the gate trench 116, such that the gate trench 116 is completely filled with the hard mask layer 122. The hard mask layer 122 may include elementary silicon (e.g., poly-silicon), a silicon-containing dielectric material (e.g., silicon nitride, silicon carbide, silicon oxynitride, and/or other suitable silicon-containing materials), an oxide material (e.g., aluminum oxide, silicon oxide, and/or other suitable oxide materials), and/or other suitable dielectric materials. In many embodiments, the hard mask layer 122 includes various combinations of the materials discussed above. In the depicted embodiment, the hard mask layer 122 includes elementary silicon. The method 200 at operation 212 may optionally perform a CMP process (not shown) to planarize a top surface of the hard mask layer 122. Alternatively, the method 200 performs the CMP process to the hard mask layer 122 after it is processed at a subsequent operation.

Figure 8:
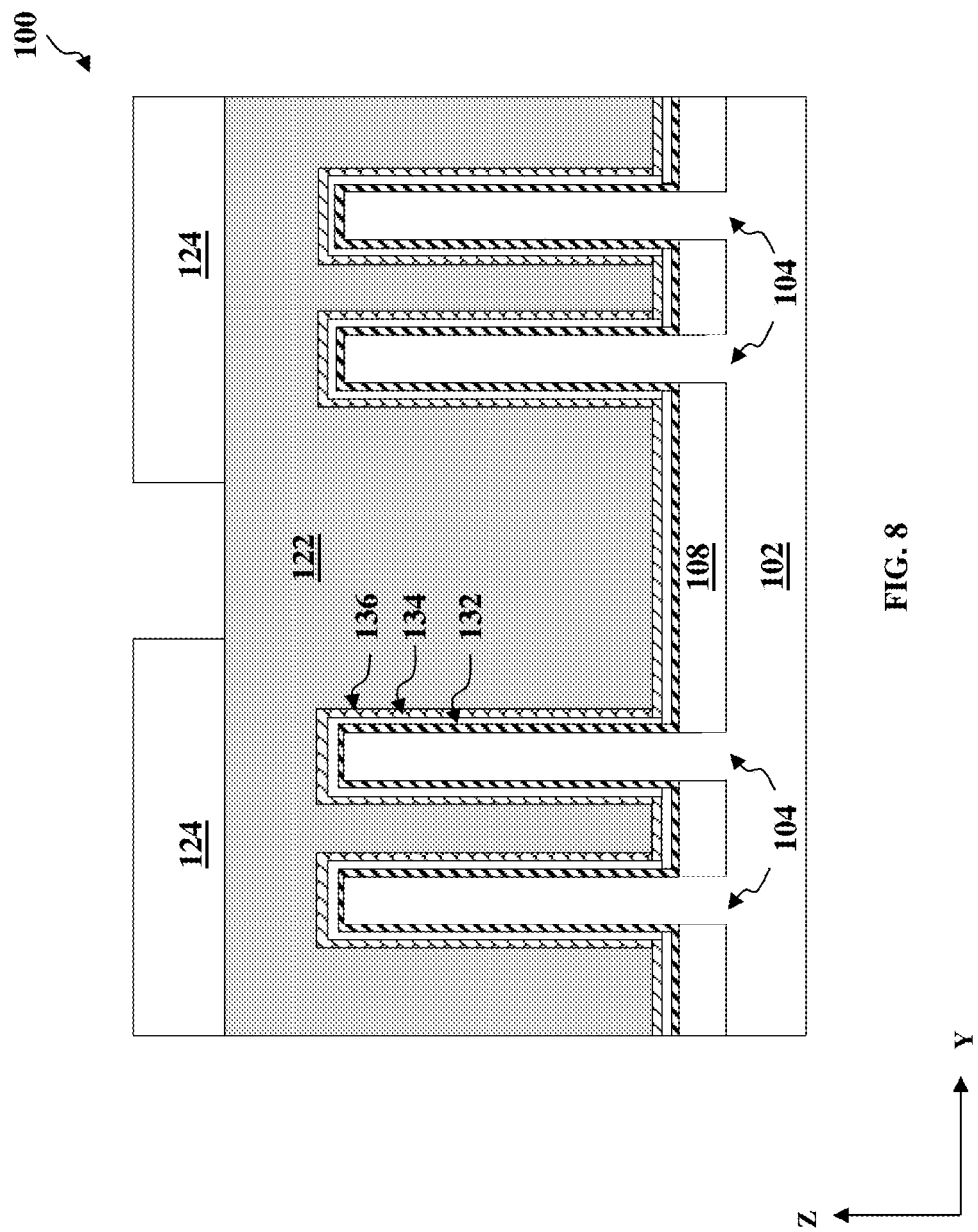

At operation 214, referring to FIGS. 3A, 8, 9A, and 9B, the method 200 patterns the hard mask layer 122 to form a cut feature (or a trench) 126 in the hard mask layer 122, the cut feature 126 being disposed between two adjacent fins 104. In the depicted embodiment, the cut feature 126 corresponds to a location where the HKMGs 110a and 110B are physically and/or electrically separated (as shown in FIGS. 1A-2C). Referring to FIG. 8, the method at operation 214 forms a patterned masking element 124 (including a resist layer) over the hard mask layer 122 by resist coating, exposing, post-exposure baking, and developing to expose a portion of the hard mask layer 122 where the cut feature 126 is to be formed. Then, the method 200 at operation 214 etches the hard mask layer 122 using the patterned masking element 124 as an etch mask to form the cut feature 126. The patterned masking element 124 is removed thereafter, for example, by resist stripping.

The etching process for forming the cut feature 126 may include wet etching, dry etching, RIE, and/or other suitable etching methods. In one example, referring to FIG. 9A, the method 200 at operation 214 etches through the hard mask layer 122, the capping layer 136, the high-k dielectric layer 134, the interfacial layer 132 (if present), and portions of the isolation structure 108, such that a bottom surface 128A of the cut feature 126 is below a top surface of the isolation structure 108. Accordingly, the method 200 implements an etching process 150 to remove portions of the hard mask layer 122, the capping layer 136, the high-k dielectric layer 134, the interfacial layer 132, and the isolation structure 108. The etching process 150 implements a dry etching process to remove the hard mask layer 122 using fluorine-containing etchant(s) (e.g., CHF3, CH3F, or NF3), chlorine-containing etchant(s) (e.g., Cl2), oxygen, other suitable etchants, or combinations thereof, followed by a wet etching process to remove the capping layer 136, the high-k dielectric layer 134, the interfacial layer 132, and portions of the isolation structure 108 using an etchant such as a mixture of hydrogen peroxide (H2O2), sulfuric acid (H2SO4), deionized water (DIW), other suitable etchants, or combinations thereof; though numerous other dry etchants, wet etchants, and combinations thereof may also be used herein.

Figure 9A:
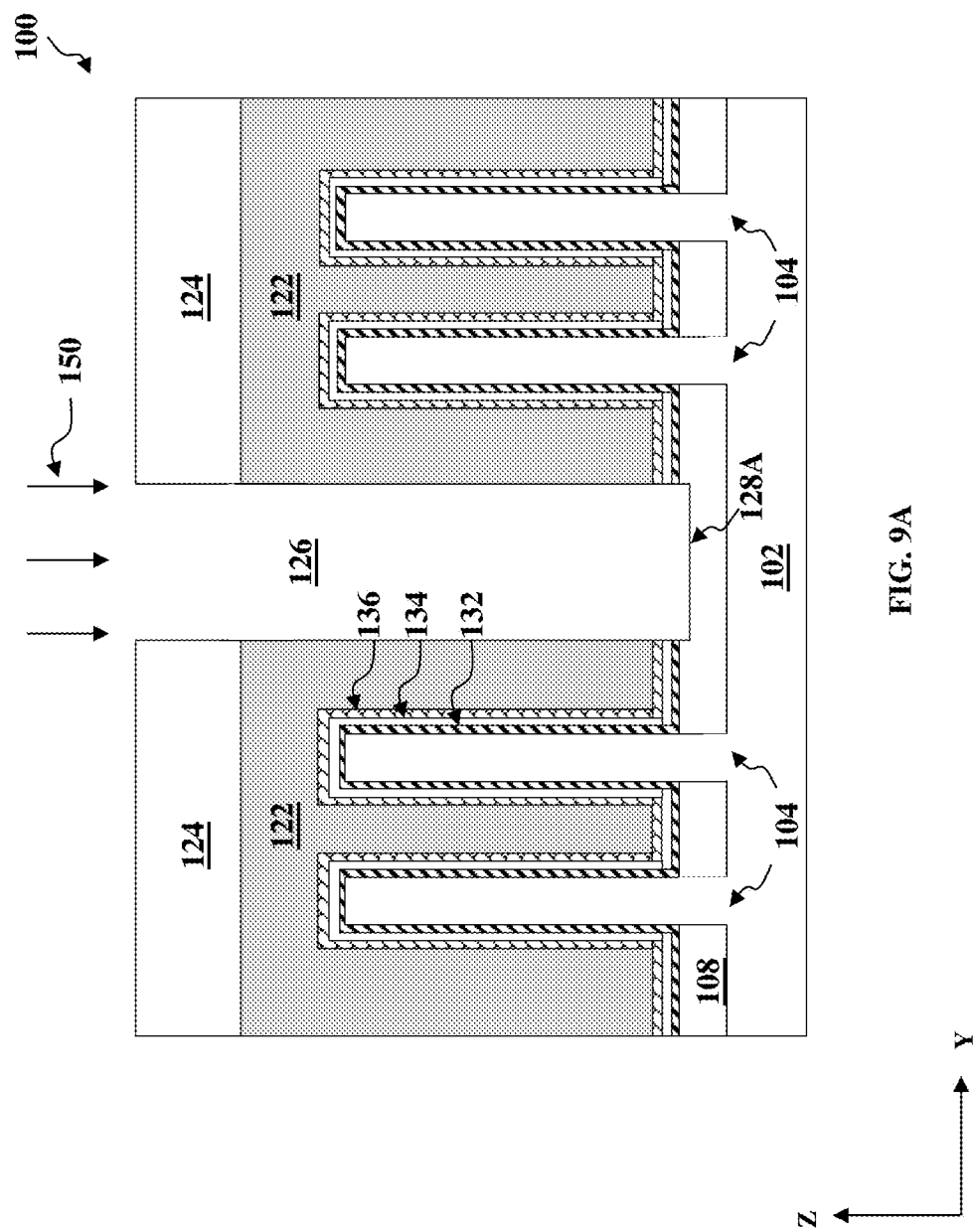
Figure 9B:
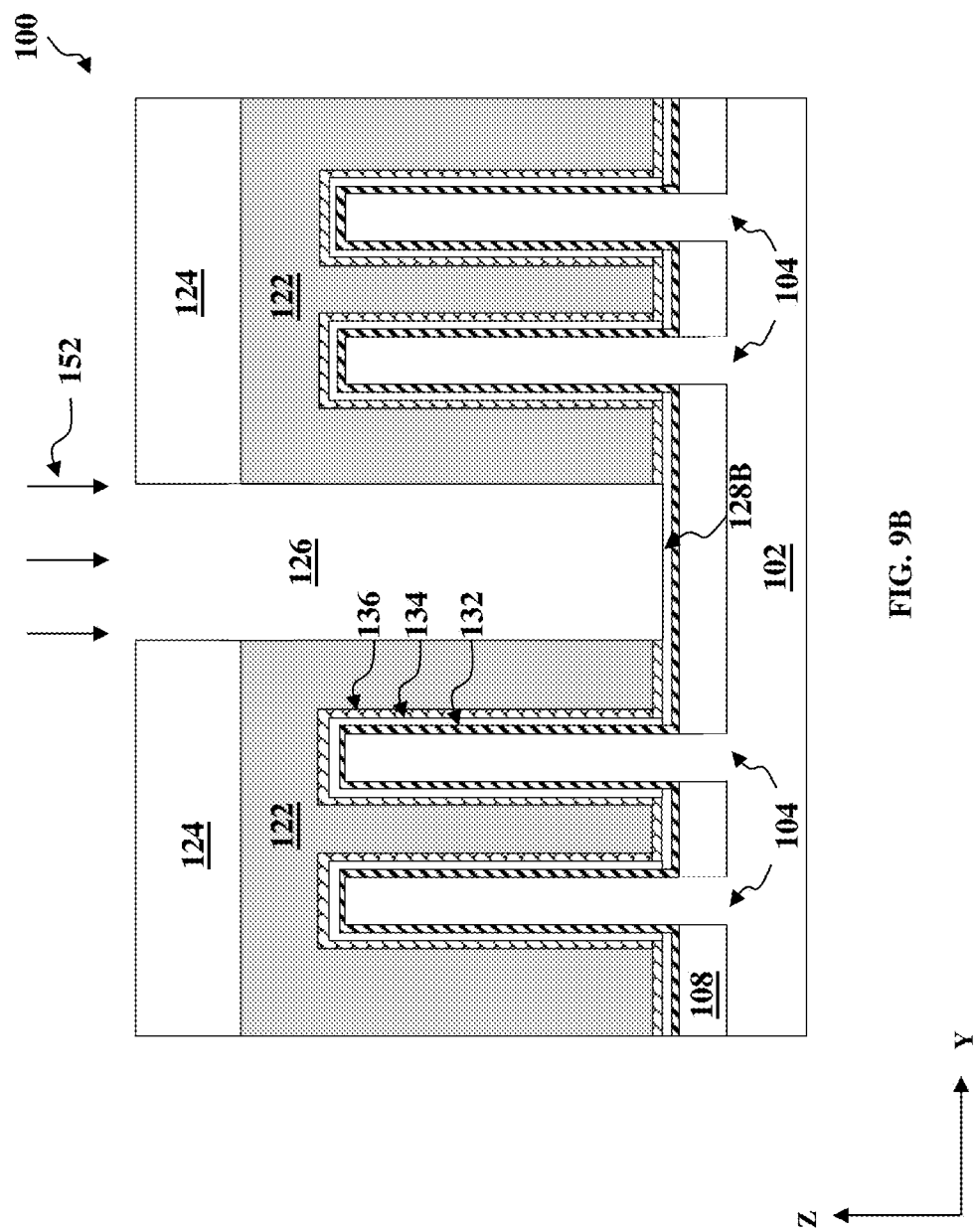

In another example, referring to FIG. 9B, the method 200 at operation 214 etches through the hard mask layer 122 and the capping layer 136, such that a bottom surface 128B of the cut feature 126 exposes the high-k dielectric layer 134. Accordingly, the method 200 implements an etching process 152 to remove the hard mask layer 122 and the capping layer 136. The etching process 152 implements a dry etching process to remove the hard mask layer 122 using a combination of fluorine-containing etchant(s) (e.g., CHF3, CH3F, or NF3), chlorine-containing etchant(s) (e.g., Cl2), oxygen, other suitable etchants, or combinations thereof, followed by an additional dry etching process to remove the capping layer 136 using fluorine-containing etchant(s) (e.g., CHF3, CH3F, or NF3), hydrogen, other suitable etchants, or combinations thereof; though numerous other dry etchants, wet etchants, and combinations thereof may also be used herein.

Figure 10A:
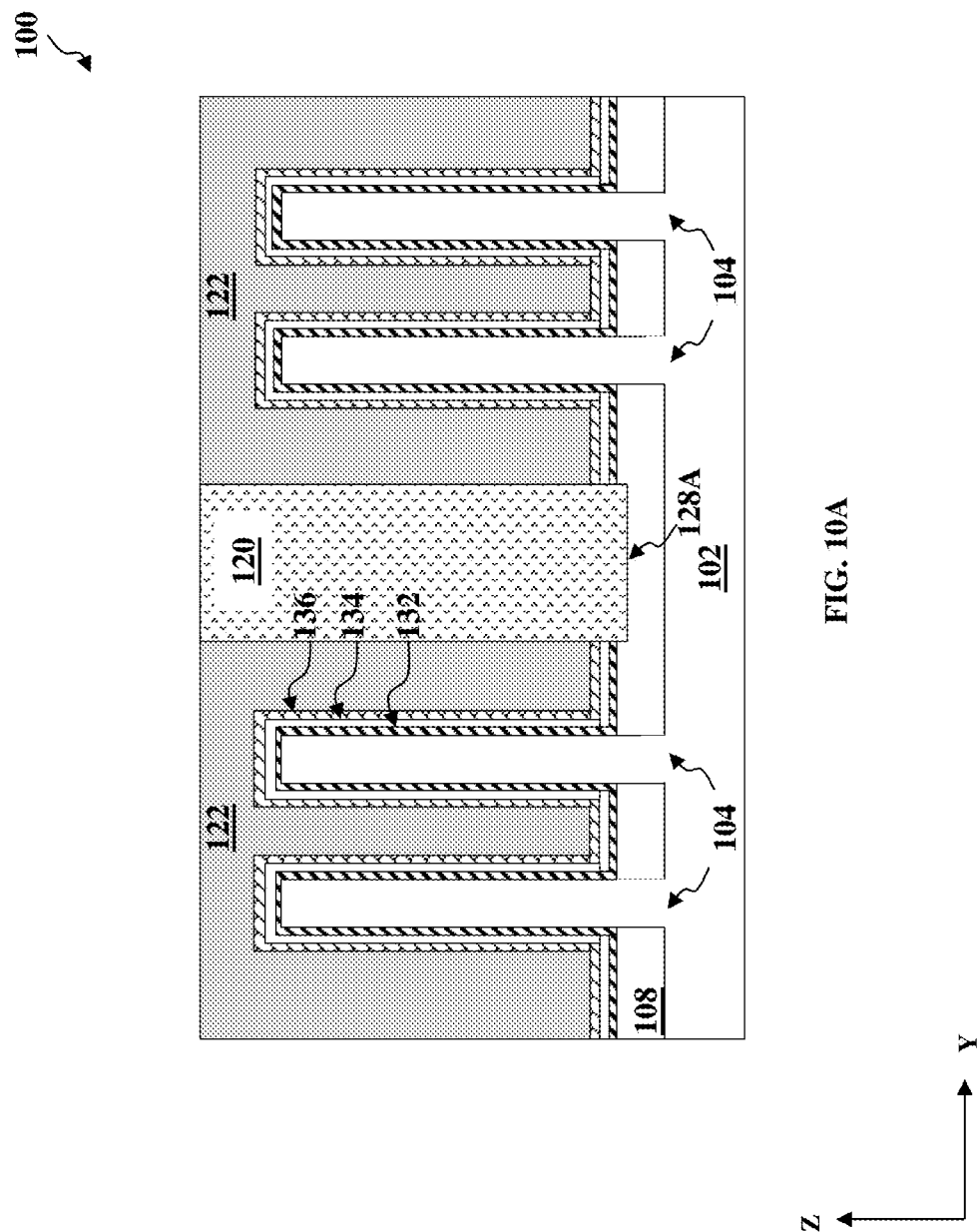
Figure 10B:
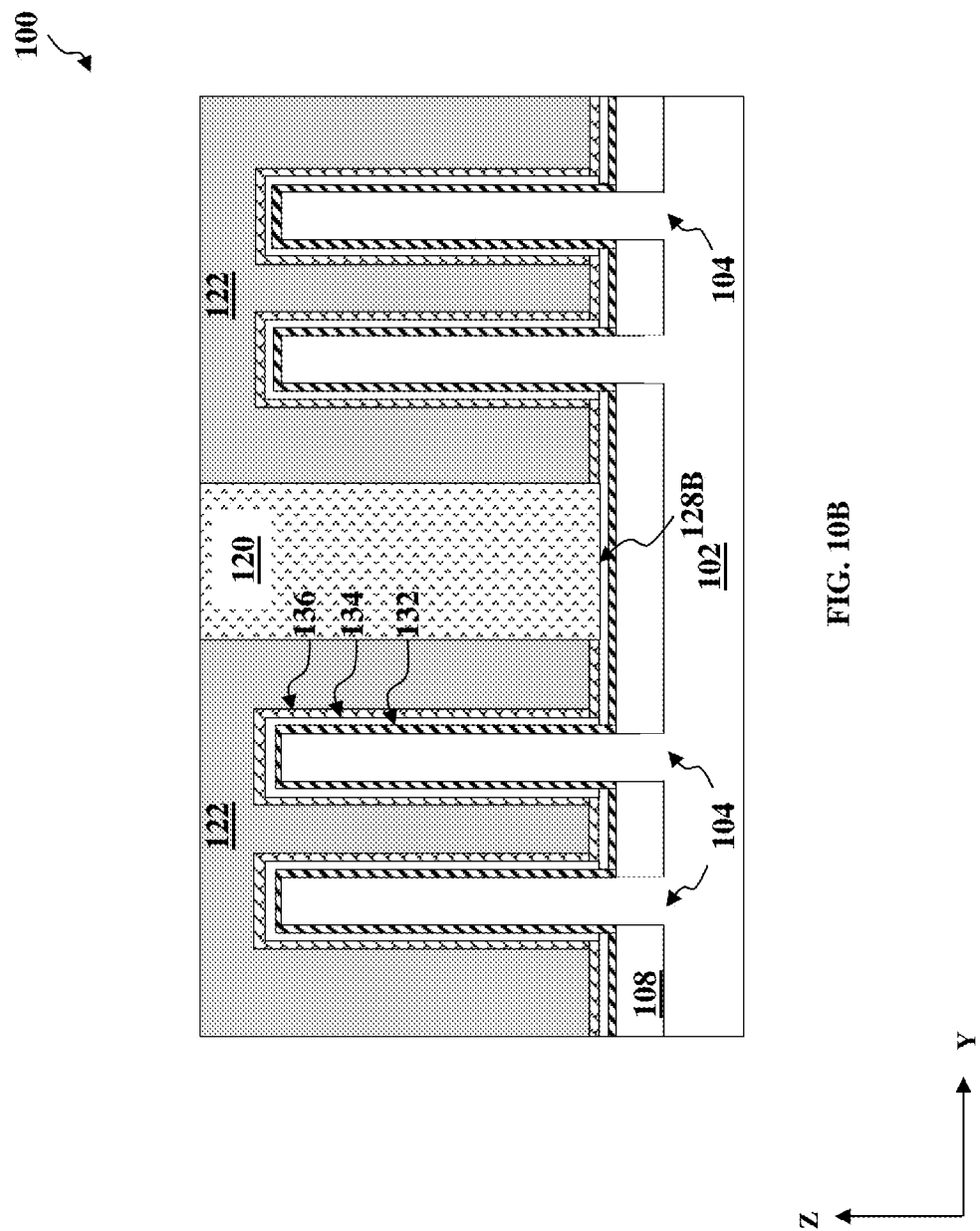

At operation 216, referring to FIGS. 3B, 10A, and 10B, which correspond to FIGS. 9A and 9B, respectively, the method 200 deposits a dielectric material layer in the cut feature 126, thereby forming the isolation feature 120. In the depicted embodiment, the isolation feature 120 includes a nitride (e.g., silicon nitride), an oxide (e.g., silicon oxide, aluminum oxide), an oxynitride (e.g., silicon oxynitride), spin-on glass (SOG), FSG, a low-k dielectric material, and/or other suitable dielectric materials. In one example, the isolation feature 120 includes a combination of dielectric materials discussed herein. The isolation feature 120 may be formed by any suitable method including CVD, ALD, FCVD, spin-coating, and/or other suitable methods. Accordingly, the isolation feature 120 thus formed may include the bottom surface 128A disposed below the top surface of the isolation structure 108 (FIG. 10A), or alternatively, include the bottom surface 128B that exposes the high-k dielectric layer 134 (FIG. 10B). For the sake of simplicity, subsequent figures and operations are discussed in reference to the configuration of the isolation feature 120 (i.e., having the bottom surface 128A) as shown in FIG. 10A; though similar operations may also be applied to the device 100 having the configuration of the isolation feature 120 as shown in FIG. 10B (i.e., having the bottom surface 128B). Subsequently, the method 200 at operation 216 optionally performs a CMP process to the device 100, such that the top surface of the isolation feature 120 is coplanar with the top surface of the hard mask layer 122.

Figure 11:
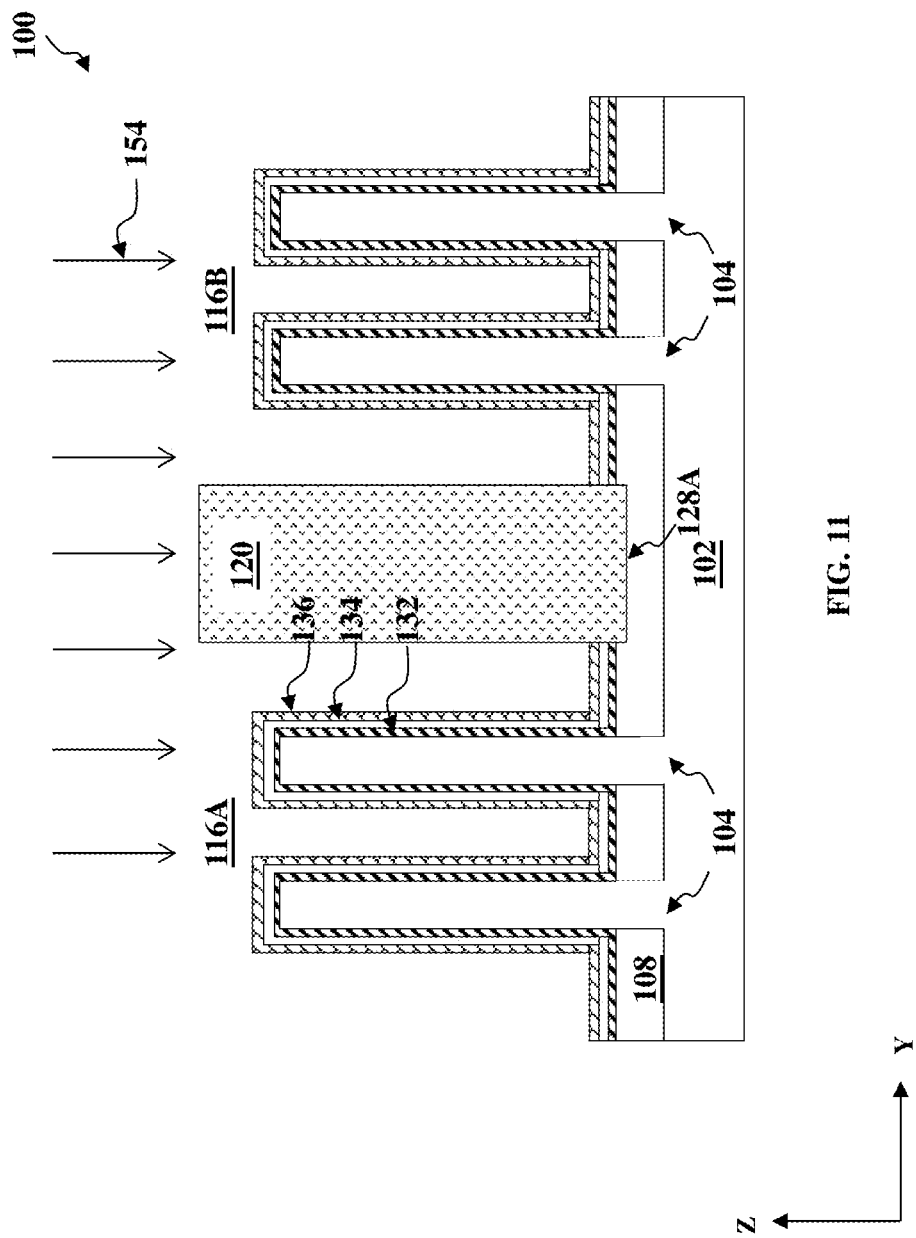

At operation 218, referring to FIGS. 3B and 11, the method 200 removes the hard mask layer 122, thereby exposing the capping layer 136 in the gate trench 116A and the gate trench 116B, the gate trench 116A and the gate trench 116B being two portions of the gate trench 116 separated by the isolation feature 120. In the depicted embodiment, the method 200 removes the hard mask layer 122 in a selective etching process 154 that implements one or more etching processes. In one example, the etching process 154 implements a dry etching process using fluorine-containing etchant(s) (e.g., CHF3, CH3F, or NF3), hydrogen, other suitable dry etchants, or combinations thereof, configured to remove the hard mask layer 122. In another example, the etching process 154 implements a wet etching process using ammonium hydroxide (NH4OH), tetramethylammonium hydroxide (TMAH), other suitable wet etchants, or combinations thereof. In the present embodiment, as will be discussed in detail below, the remaining portions (e.g., the conductive electrode) of the HKMG 110A are subsequently formed in the gate trench 116A and the remaining portions (e.g., the conductive electrode) of the HKMG 110B are subsequently formed in the gate trench 116B.

Figure 12:
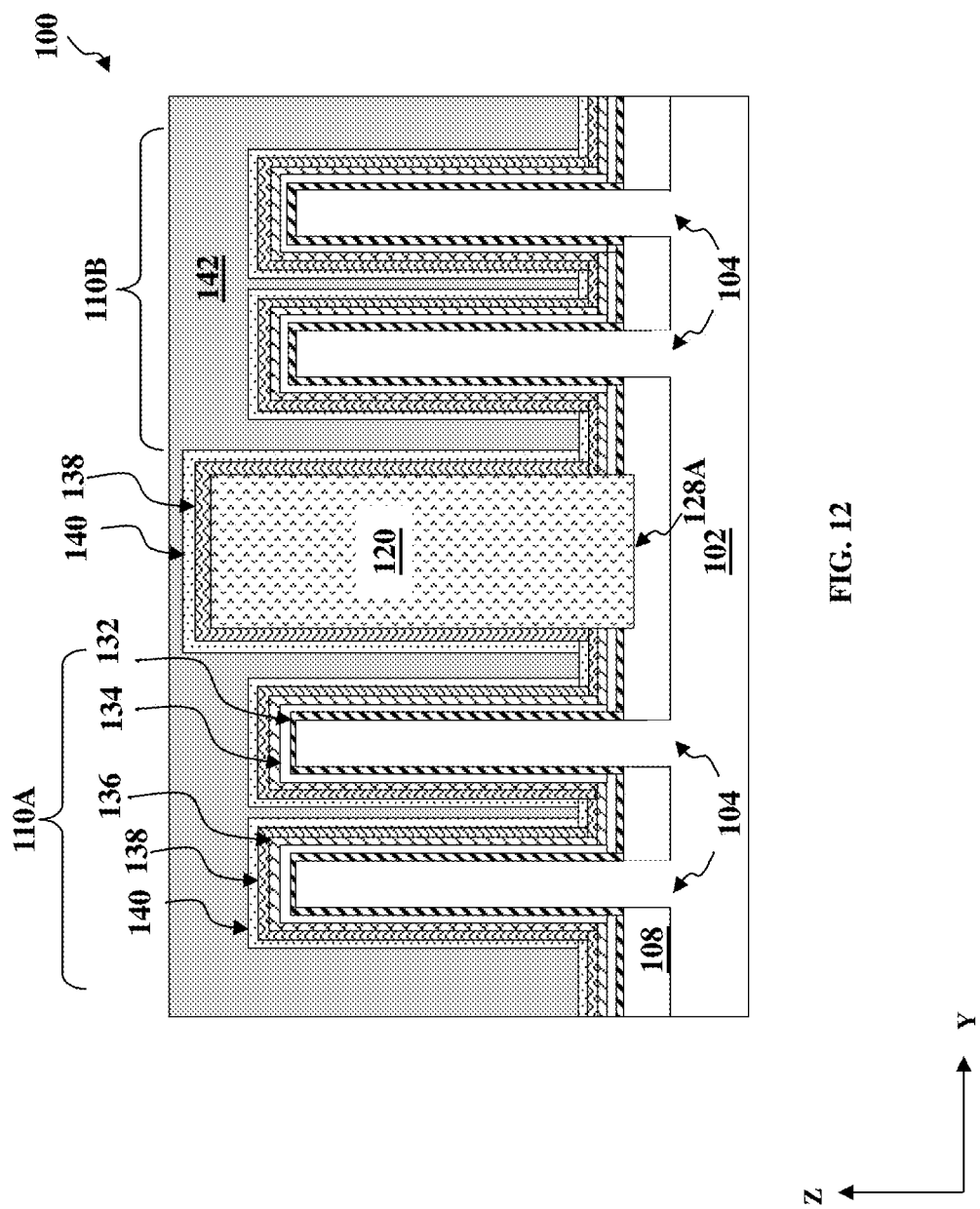

At operation 220, referring to FIGS. 3B and 12, the method 200 forms the barrier layer 138 over portions of the capping layer 136 exposed in the gate trench 116A and the gate trench 116B, as well as over sidewalls surfaces and the top surface of the isolation feature 120. Accordingly, the barrier layer 138 is configured to a "U" shaped in the space defined by a sidewall of the fins 104 and a sidewall of the isolation feature 120, such that the bottom of the "U" is disposed over the capping layer 136 in the Y direction, one side of the "U" is disposed over the capping layer 136 formed on the sidewall of the fins 104, and the other side of the "U" is disposed along (i.e., contacting) the sidewall of the isolation feature 120. The various materials suitable for forming the barrier layer 138 have been discussed above in reference to FIGS. 2A-2D. In the depicted embodiment, the barrier layer 138 includes a tantalum-containing conductive layer, such as tantalum silicon nitride (TaSiN), tantalum nitride (TaN), tantalum carbide (TaC), tantalum carbide nitride (TaCN), and/or other suitable tantalum-containing conductive materials. In some embodiments, the barrier layer 138 is omitted from the device 100, such that the subsequently formed material layer (e.g., the work function metal layer 140) is also configured to a "U" shape in the space defined by the fins 104 and the sidewalls of the isolation feature 120. The barrier layer 138 may be formed by any suitable process such as CVD, PVD, ALD, LPCVD, PECVD, HDPCVD, MOCVD, RPCVD, APCVD, and/or other suitable deposition processes.

At operation 222, referring to FIGS. 3B and 12, the method 200 forms the work function metal layer 140 in the gate trench 116A and the gate trench 116B, and over the sidewalls and the top surface of the isolation feature 120. In the depicted embodiment, the work function metal layer 140 is formed over the barrier layer 138. In embodiments where the barrier layer 138 is omitted, the work function metal layer 140 is formed over portions of the capping layer 136 exposed in the gate trench 116A and the gate trench 116B, and over (thereby contacting) the sidewalls and the top surface of the isolation feature 120. The various materials suitable for forming the work function metal layer 140 have been discussed above in reference to FIGS. 2A-2D. The work function metal layer 140 may include multiple material layers of the same or different type (n-type or p-type) in order to achieve a desired threshold voltage in the resulting HKMGs 110A and 110B. In the depicted embodiment, the work function metal layer 140 formed in the gate trench 116A and the gate trench 116B includes the same materials. However, the method 200 may also implement different deposition processes such that the work function metal layer 140 formed in the gate trench 116A has a different composition from that of the gate trench 116B. The work function metal layer 140 (or each of the multiple layers included therein) may be deposited by any suitable process such as CVD, PVD, ALD, LPCVD, PECVD, HDPCVD, MOCVD, RPCVD, APCVD, and/or other suitable deposition processes.

At operation 224, still referring to FIGS. 3B and 12, the method 200 forms the bulk conductive layer 142 over the work function metal layer 140, thereby filling the gate trench 116A and the gate trench 116B. The various materials suitable for forming the bulk conductive layer 142 have been discussed in reference to FIGS. 2A-2D. In the depicted embodiment, the bulk conductive layer 142 is deposited simultaneously in the gate trench 116A and the gate trench 116B. However, the present disclosure may also implement different deposition processes such that the bulk conductive layer 142 in the gate trench 116A is formed separately from the bulk conductively layer 142 in the gate trench 116B. The bulk conductive layer 142 may be deposited by any suitable process such as CVD, PVD, ALD, LPCVD, PECVD, HDP-CVD, MOCVD, RPCVD, APCVD, electroplating, electroless plating, and/or other suitable deposition processes.

Figure 13:
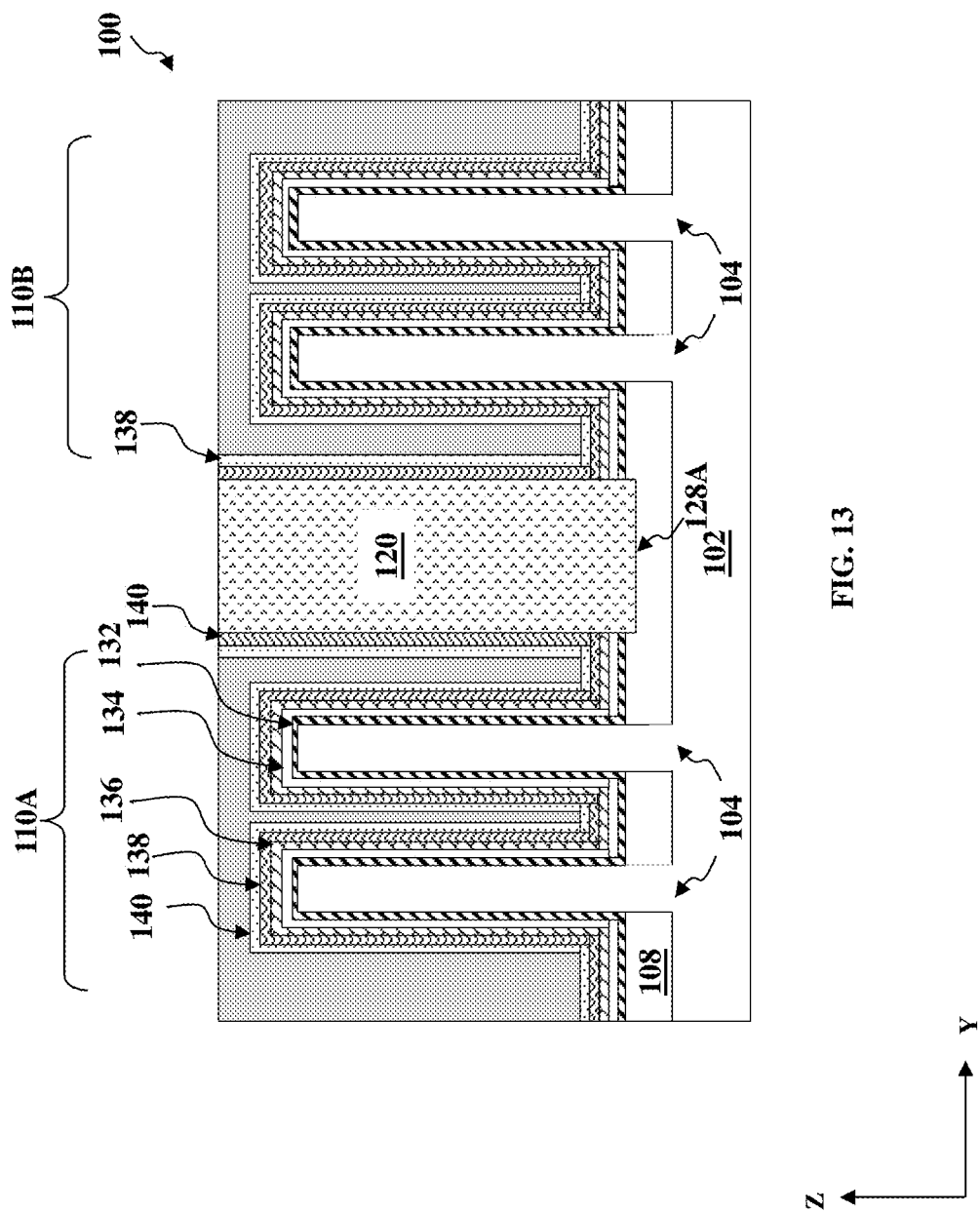

At operation 226, referring to FIGS. 3B and 13, the method 200 performs one or more CMP processes to remove top portions of the bulk conductive layer 142, the work function metal layer 140, and/or the barrier layer 138, thereby exposing the top surface of the isolation feature 120. As such, a top surface of each of the barrier layer 138, the work function metal layer 140, and the bulk conductive layer 142 is coplanar with the top surface of the isolation feature 120, while the top surface of each of the capping layer 136 and the high-k dielectric layer 134 is below the top surface of the isolation feature 120.

Subsequently, at operation 228, the method 200 performs additional processing steps to the device 100. For example, additional vertical interconnect features such as contacts and/or vias, and/or horizontal interconnect features such as lines, and multilayer interconnect features such as metal layers and interlayer dielectrics can be formed over the device 100. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. By forming a high-k dielectric layer and a capping layer prior to forming an isolation feature that separates the resulting HKMGs (i.e., completing the cutting or etching of the partially formed HKMG), the number of material layers formed on the sidewalls of isolation feature is reduced, thereby enlarging the end-cap processing window that is otherwise limited in a CPG process. Additionally, by completing the cutting process prior to forming the conductive gate electrode (e.g., work function metal layer(s) and a bulk conductive layer), adverse effects brought about by etchant gases on the ILD layer, the source/drain features, and/or threshold voltage of the work function metal layer(s) may be reduced (or minimized).

In one aspect, the present disclosure provides a method that includes removing a dummy gate structure formed over a first fin and a second fin, thereby forming a trench that exposes portions of the first fin and the second fin, forming a high-k dielectric layer over the exposed portions of the first fin and the second fin, forming a capping layer over the high-k dielectric layer, forming a hard mask layer over the capping layer, forming an isolation feature in the hard mask layer between the first fin and the second fin, the isolation feature having sidewalls that extend through the capping layer, removing the hard mask layer, and forming a conductive electrode over the capping layer and along the sidewalls of the isolation feature. In some embodiments, the forming of the hard mask layer fills the trench completely. In some embodiments, the removing exposes the capping layer and the sidewalls of the isolation feature. In some embodiments, the method further includes performing a chemical-mechanical polishing (CMP) subsequent to the forming the hard mask layer.

In some embodiments, the trench is a first trench, where the forming of the isolation feature includes forming a second trench in the hard mask layer between the first fin and the second fin, filling the second trench with an insulating material, and performing a chemical-mechanical polishing (CMP), such that a top surface of the isolation feature is coplanar with a top surface of the hard mask layer. In further embodiments, the forming of the second trench removes a portion of the capping layer. In some embodiments, the forming of the second trench removes a portion of the high-k dielectric layer.

In some embodiments, the removing of the hard mask layer includes performing a first dry etching process using a first etchant that includes $O_2$, $CHF_3$, $CH_3F$, $Cl_2$, or combinations thereof, and subsequently performing a second dry etching process using a second etchant that includes $NF_3$, $H_2$, or combinations thereof.

In some embodiments, the removing of the hard mask layer includes performing a dry etching process using a first etchant that includes $O_2$, $CHF_3$, $CH_3F$, $Cl_2$, or combinations thereof, and subsequently performing a wet etching process using a second etchant that includes sulfuric acid, hydrogen peroxide, or combinations thereof.

In some embodiments, the forming of the conductive electrode layer includes forming a work function metal layer and a bulk conductive layer.

In another aspect, the present disclosure provides a method that includes providing a semiconductor structure that includes a first fin and a second fin formed over a substrate, and a dummy gate structure formed over a channel region of the first fin and the second fin, where bottom portions of the first fin and the second fin being separated by an isolation structure, removing the dummy gate structure, thereby forming a first trench over the first fin and the second fin, forming a high-k dielectric layer in the first trench, forming a capping layer over the high-k dielectric layer in the first trench, filling the first trench with a hard mask material, thereby forming a hard mask layer over the capping layer, patterning the hard mask layer to form a second trench, the second trench being disposed between the first fin and the second fin, filling the second trench with a dielectric material to form a dielectric feature, removing the hard mask layer to expose the dielectric feature and the first trench, forming a work function metal layer in the first trench, such that the work function metal layer forms a U-shape along a sidewall of the dielectric feature, forming a bulk conductive layer over the work function metal layer in the first trench, and planarizing the bulk conductive layer and the work function metal layer to expose a top surface of the dielectric feature.

In some embodiments, the forming of the second trench exposes the high-k dielectric layer. In further embodiments, the forming of the second trench includes performing a first dry etching process using a first etchant that includes $O_2$, $CHF_3$, $CH_3F$, $Cl_2$, or combinations thereof, and subsequently performing a second dry etching process using a second etchant that includes $NF_3$, $H_2$, or combinations thereof.

In some embodiments, the forming of the second trench removes a portion of the isolation structure. In further embodiments, the forming of the second trench includes performing a dry etching process using a first etchant that includes $O_2$, $CHF_3$, $CH_3F$, $Cl_2$, or combinations thereof, and subsequently performing a wet etching process using a second etchant that includes sulfuric acid, hydrogen peroxide, or combinations thereof.

In some embodiments, the method further includes forming a barrier layer in the first trench after the removing of the hard mask layer and before the forming of the work function metal layer.

In some embodiments, the forming of the hard mask layer includes depositing elementary silicon over the capping layer. In alternative embodiments, the forming of the hard mask layer includes depositing an oxide-based material over the capping layer.

In yet another aspect, the present disclosure provides a semiconductor structure that includes a fin protruding out of a substrate, an isolation structure disposed over the substrate, a top surface of the isolation structure being below a top surface of the fin, a high-k metal gate (HKMG) disposed over the fin and the isolation structure, where the HKMG includes a high-k dielectric layer disposed over the fin and the top surface of the isolation structure, a capping layer disposed over the high-k dielectric layer, a work function metal layer disposed over the capping layer, and a bulk conductive layer disposed over the work function metal layer, and a dielectric feature disposed over the substrate, where the dielectric feature defines a sidewall of the HKMG.

In some embodiments, the top surface of the dielectric feature is above a top surface of the capping layer, and the work function metal layer is configured to have a U shape disposed along and in physical contact with a sidewall of the dielectric feature.

In some embodiments, a bottom surface of the dielectric feature extends through the capping layer to contact the high-k dielectric layer. In some embodiments, a bottom surface of the dielectric feature is below the top surface of the isolation structure.

In some embodiments, with the fin being disposed in a first direction and the HKMG being disposed in a second direction generally perpendicular to the first direction, the HKMG further includes, in a cross-sectional view along the second direction, a tantalum-containing conductive layer disposed over the capping layer, wherein the tantalum-containing conductive layer extends to contact a sidewall of the dielectric feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  removing a dummy gate structure disposed over a first fin and a second fin to form a gate trench;
  forming a high-k dielectric layer in the gate trench;
  forming a hard mask layer over the high-k dielectric layer to fill the gate trench;
  forming an isolation feature in the hard mask layer between the first fin and the second fin, the isolation feature having sidewalls that extend through a bottom surface of the hard mask layer;
  removing the hard mask layer to expose the sidewalls of the isolation feature;
  forming a work function metal layer over the high-k dielectric layer, such that the work function metal layer is formed over the sidewalls and a top surface of the isolation feature;

forming a bulk conductive layer over the work function metal layer; and removing a portion of the work function metal layer formed over the top surface of the isolation feature, such that a top surface of the work function metal layer is substantially coplanar with the top surface of the isolation feature.

2. The method of claim 1, wherein removing the portion of the work function metal layer includes performing a chemical-mechanical polishing (CMP) process to the work function metal layer.

3. The method of claim 1, wherein forming the isolation feature includes:

forming an opening in the hard mask layer between the first fin and the second fin;

filling the opening with an insulating material; and performing a chemical-mechanical polishing (CMP) to planarize a top surface of the hard mask layer.

4. The method of claim 3, wherein bottom portions of the first fin and the second fin are separated by an isolation structure, and wherein forming the opening removes a portion of the isolation structure.

5. The method of claim 1, further comprising forming a capping layer over the high-k dielectric layer before forming the work function metal layer.

6. The method of claim 1, wherein removing the hard mask layer includes performing a first dry etching process using a first etchant that includes $O_2$, $CHF_3$, $CH_3F$, $Cl_2$, or combinations thereof, and subsequently performing a second dry etching process using a second etchant that includes $NF_3$, $H_2$, or a combination thereof.

7. The method of claim 1, wherein removing the hard mask layer includes performing a dry etching process using a first etchant that includes $O_2$, $CHF_3$, $CH_3F$, $Cl_2$, or combinations thereof, and subsequently performing a wet etching process using a second etchant that includes sulfuric acid, hydrogen peroxide, or a combination thereof.

8. A method, comprising:

providing a semiconductor structure that includes:
a first fin and a second fin formed over a substrate, bottom portions of the first fin and the second fin being separated by an isolation structure; and
a dummy gate structure formed over a channel region of the first fin and the second fin;

removing the dummy gate structure to form a trench exposing the first fin and the second fin;

depositing a high-k dielectric layer in the trench;

depositing a hard mask layer over the high-k dielectric layer;

forming an opening in the hard mask layer between the first fin and the second fin;

forming a dielectric feature in the opening;

removing the hard mask layer to expose the trench;

depositing a work function metal layer in the trench such that a portion of the work function metal layer is deposited on a sidewall of the dielectric feature; and forming a bulk conductive layer over the work function metal layer.

9. The method of claim 8, wherein forming the opening in the hard mask layer exposes the high-k dielectric layer.

10. The method of claim 9, wherein forming the opening includes performing a first dry etching process using a first etchant that includes $O_2$, $CHF_3$, $CH_3F$, $Cl_2$, or combinations thereof, and subsequently performing a second dry etching process using a second etchant that includes $NF_3$, $H_2$, or a combination thereof.

11. The method of claim 8, wherein forming the opening removes a portion of the isolation structure.

12. The method of claim 11, wherein forming the opening includes performing a dry etching process using a first etchant that includes $O_2$, $CHF_3$, $CH_3F$, $Cl_2$, or combinations thereof, and subsequently performing a wet etching process using a second etchant that includes sulfuric acid, hydrogen peroxide, or a combination thereof.

13. The method of claim 8, further comprising forming a barrier layer in the trench after removing the hard mask layer and before depositing the work function metal layer.

14. The method of claim 8, wherein forming the hard mask layer includes depositing silicon over the high-k dielectric layer.

15. The method of claim 8, wherein forming the hard mask layer includes depositing an oxide-based material over the high-k dielectric layer.

16. A semiconductor structure, comprising:

a fin protruding from a substrate;

a high-k metal gate (HKMG) disposed over the fin, wherein a first portion of the HKMG includes a high-k dielectric layer disposed over the fin, a work function metal layer disposed over the high-k dielectric layer, and a bulk conductive layer disposed over the work function metal layer, and wherein a top surface of the work function metal layer is substantially coplanar with a top surface of the bulk conductive layer; and a dielectric feature disposed over the substrate and adjacent to the HKMG, wherein a second portion of the HKMG includes the work function metal layer disposed vertically along a sidewall of the dielectric feature and the bulk conductive layer disposed over the work function metal layer.

17. The semiconductor structure of claim 16, wherein a bottom surface of the dielectric feature is defined by the high-k dielectric layer.

18. The semiconductor structure of claim 16, further comprising an isolation structure disposed over the substrate, wherein a top surface of the isolation structure is below a top surface of the fin, and wherein a bottom surface of the dielectric feature is below the top surface of the isolation structure.

19. The semiconductor structure of claim 16, wherein the HKMG further includes a barrier layer interposing between the work function metal layer and the high-k dielectric layer.

20. The semiconductor structure of claim 16, wherein the top surface of the work function metal layer is substantially planar with a top surface of the dielectric feature.

* * * * *